(12) United States Patent
Levesque et al.

(10) Patent No.: US 9,330,544 B2
(45) Date of Patent: *May 3, 2016

(54) SYSTEM AND METHOD FOR SIMULATED PHYSICAL INTERACTIONS WITH HAPTIC EFFECTS

(71) Applicant: Immersion Corporation, San Jose, CA (US)

(72) Inventors: Vincent Levesque, Montreal (CA); Juan Manuel Cruz-Hernandez, West Montreal (CA); Amaya Weddle, San Jose, CA (US); David M. Birnbaum, Oakland, CA (US)

(73) Assignee: Immersion Corporation, San Jose, CA (US)

( * ) Notice: Subject to any disclaimer, the term of this patent is extended or adjusted under 35 U.S.C. 154(b) by 132 days.

This patent is subject to a terminal disclaimer.

(21) Appl. No.: 13/830,087

(22) Filed: Mar. 14, 2013

(65) Prior Publication Data

US 2014/0139450 A1    May 22, 2014

Related U.S. Application Data

(60) Provisional application No. 61/728,665, filed on Nov. 20, 2012, provisional application No. 61/728,661, filed on Nov. 20, 2012, provisional application No. 61/728,727, filed on Nov. 20, 2012.

(51) Int. Cl.
*G08B 6/00* (2006.01)
*G06F 3/01* (2006.01)
(Continued)

(52) U.S. Cl.
CPC ............... *G08B 6/00* (2013.01); *A63F 13/214* (2014.09); *A63F 13/285* (2014.09); *G06F 3/016* (2013.01);
(Continued)

(58) Field of Classification Search
CPC ........... A63F 2300/1037; H03K 17/96; H03K 17/962; H03K 17/9622; H03K 2217/96062; G09B 21/003; G09B 21/004; G09B 21/005; G09B 21/007; G09B 21/008; G06F 3/016; G06F 3/041–3/048; G06F 1/1692; G06F 2203/04808; G06F 2203/0409; G06F 2203/014; G01C 21/3664; A61M 2205/505
USPC .......... 715/702, 863, 701, 773; 345/173–177, 345/156, 168, 157, 169, 163; 340/407.1, 340/407.2; 341/27; 455/566
See application file for complete search history.

(56) References Cited

U.S. PATENT DOCUMENTS 6,703,924 B2   3/2004  Tecu et al.
7,742,036 B2   6/2010  Grant et al.
(Continued)

FOREIGN PATENT DOCUMENTS

WO    WO 2010105001 A1 *  9/2010

OTHER PUBLICATIONS

European Patent Office, Extended Search Report, European Application No. 13192388, dated Feb. 5, 2014.
(Continued)

*Primary Examiner* — Nalini Mummalaneni
(74) *Attorney, Agent, or Firm* — Kilpatrick Townsend & Stockton LLP

(57) ABSTRACT

A system of the present disclosure may include a sensor configured to detect user interaction with a touch surface and transmit a sensor signal associated with the user interaction; a processor in communication with the sensor, the processor configured to: determine a position of the user interaction based on the sensor signal, determine a feature associated with the position of the user interaction, control a device associated with the feature, modify a display signal based in part on the user interaction, select a haptic effect to generate based at least in part on user interaction and the position, the haptic effect selected to simulate the feature, and transmit a haptic signal to generate the haptic effect, and a haptic output device in communication with the processor and coupled to the touch surface, the haptic output device configured to receive a haptic signal and output a haptic effect.

21 Claims, 14 Drawing Sheets

(51) Int. Cl.
   *G06F 3/041* (2006.01)
   *G06F 3/0488* (2013.01)
   *A63F 13/214* (2014.01)
   *A63F 13/285* (2014.01)

(52) U.S. Cl.
   CPC ............ *G06F 3/0416* (2013.01); *G06F 3/0488* (2013.01); *G06F 3/0414* (2013.01); *G06F 2203/014* (2013.01)

(56) References Cited

U.S. PATENT DOCUMENTS

| | | |
|---|---|---|
| 7,916,002 B2 * | 3/2011 | Uusitalo et al. ............ 340/407.2 |
| 7,924,144 B2 | 4/2011 | Makinen et al. |
| 7,982,588 B2 | 7/2011 | Makinen et al. |
| 8,026,798 B2 | 9/2011 | Makinen et al. |
| 8,174,373 B2 | 5/2012 | Makinen et al. |
| 8,330,590 B2 | 12/2012 | Poupyrev et al. |
| 8,405,618 B2 | 3/2013 | Colgate |
| 2005/0122317 A1 | 6/2005 | Schaaf et al. |
| 2008/0024459 A1 | 1/2008 | Poupyrev et al. |
| 2010/0231367 A1 | 9/2010 | Cruz-Hernandez et al. |
| 2010/0231508 A1 | 9/2010 | Cruz-Hernandez et al. |
| 2010/0231539 A1 | 9/2010 | Cruz-Hernandez et al. |
| 2010/0231540 A1 | 9/2010 | Cruz-Hernandez et al. |
| 2010/0231541 A1 | 9/2010 | Cruz-Hernandez et al. |
| 2010/0231550 A1 | 9/2010 | Cruz-Hernandez et al. |
| 2011/0021272 A1 * | 1/2011 | Grant et al. ..................... 463/30 |
| 2011/0216025 A1 | 9/2011 | Kurita |
| 2011/0285666 A1 | 11/2011 | Poupyrev et al. |
| 2011/0300910 A1 * | 12/2011 | Choi ............................ 455/566 |
| 2012/0133494 A1 | 5/2012 | Cruz-Hernandez et al. |
| 2012/0154330 A1 | 6/2012 | Shimizu |
| 2012/0268412 A1 | 10/2012 | Cruz-Hernandez et al. |
| 2013/0057509 A1 | 3/2013 | Cruz-Hernandez et al. |
| 2014/0118127 A1 | 5/2014 | Levesque et al. |
| 2014/0139451 A1 | 5/2014 | Levesque et al. |
| 2014/0139452 A1 | 5/2014 | Levesque et al. |

OTHER PUBLICATIONS

Bau, O. et al., TeslaTouch: Electrovibration for touch surfaces, UIST '10 Proceedings of the 23nd annual ACM symposium on User interface software and technology, pp. 283-292, 2010.

Levesque et al., Enhancing physicality in touch interaction with programmable friction, CHI '11 Proceedings of the SIGCHI Conference on Human Factors in Computing Systems, pp. 2481-2490, 2011.

Levesque et al., Exploring the Design Space of Programmable Friction for Scrolling Interactions, 2012 IEEE Haptics Symposium (HAPTICS), pp. 23-30.

United States Patent and Trademark Office, Office Action, U.S. Appl. No. 13/830,162 mailed Nov. 18, 2014.

United States Patent and Trademark Office, Office Action, U.S. Appl. No. 13/830,125 mailed Dec. 29, 2014.

* cited by examiner

SYSTEM AND METHOD FOR SIMULATED PHYSICAL INTERACTIONS WITH HAPTIC EFFECTS

CROSS-REFERENCE TO RELATED APPLICATIONS

This application claims priority to Provisional Application No. 61/728,665, filed on Nov. 20, 2012, and entitled "Systems and Methods for Providing Mode or State Awareness with Programmable Surface Texture;" Provisional Application No. 61/728,661, filed on Nov. 20, 2012, and entitled "System and Method for Feedforward and Feedback with Electrostatic Friction;" and Provisional Application No. 61/728,727, filed on Nov. 20, 2012, and entitled "System and Method for Simulated Physical Interactions with Electrostatic Friction," the entirety of each of which is incorporated by reference herein.

BACKGROUND

Touch enabled devices have become increasingly popular. For instance, mobile and other devices may be configured with touch-sensitive displays so that a user can provide input by touching portions of the touch-sensitive display. As another example, a touch enabled surface separate from a display may be used for input, such as a trackpad, mouse, or other device. Furthermore, some touch enabled devices make use of haptic effects, for example, haptic effects that change the coefficient of friction a user feels on a touch-surface. This type of haptic effect can be used to provide various information to the user. Thus, there is a need for simulated physical interactions with haptic effects.

SUMMARY

Embodiments of the present disclosure include devices featuring surface-based haptic effects that simulate one or more features in a touch area. Features may comprise, for example, changes in texture, coefficient of friction, and/or simulation of boundaries, obstacles, or other discontinuities in the touch surface that can be perceived through use of an object in contact with the surface. Devices including surface-based haptic effects may be more user friendly and may provide a more compelling user experience.

In one embodiment, a system of the present disclosure may comprise a sensor configured to detect an interaction with a touch surface and transmit a sensor signal associated with the interaction; a processor in communication with the sensor, the processor configured to: determine an operation available on a device, the operation associated with a first user interaction; determine a simulated texture associated with the operation; output a haptic signal associated with the simulated texture; determine whether to perform the operation based on a second user interaction; and a haptic output device in communication with the processor and coupled to the touch surface, the haptic output device configured to receive a haptic signal and output a haptic effect on the touch surface based in part on the haptic signal.

This illustrative embodiment is mentioned not to limit or define the limits of the present subject matter, but to provide an example to aid understanding thereof. Illustrative embodiments are discussed in the Detailed Description, and further description is provided there. Advantages offered by various embodiments may be further understood by examining this specification and/or by practicing one or more embodiments of the claimed subject matter.

BRIEF DESCRIPTION OF THE DRAWINGS

A full and enabling disclosure is set forth more particularly in the remainder of the specification. The specification makes reference to the following appended figures.

DETAILED DESCRIPTION

Figure 1A:
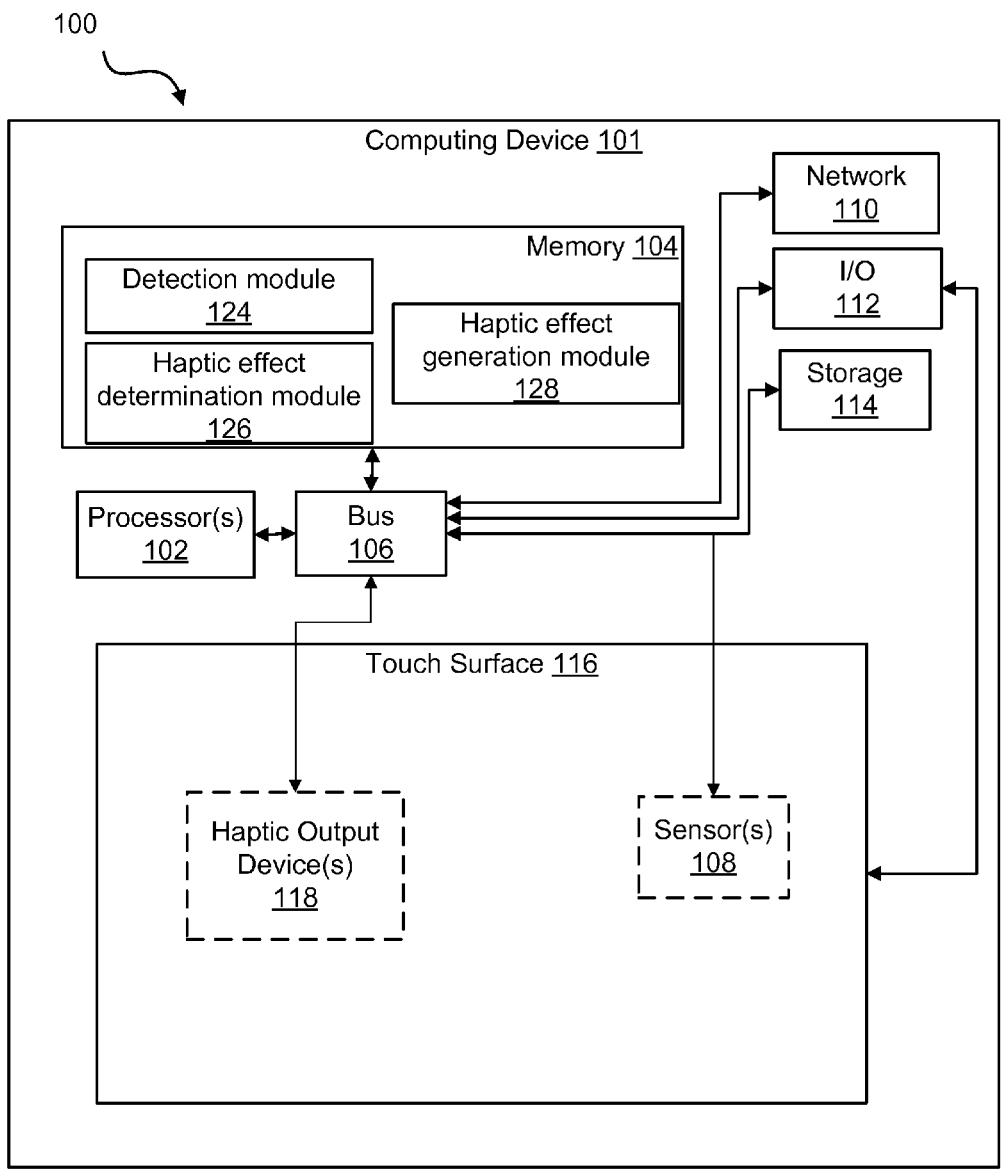
FIG. 1A shows an illustrative system for simulated physical interactions with haptic effects.

Reference will now be made in detail to various and alternative illustrative embodiments and to the accompanying drawings. Each example is provided by way of explanation, and not as a limitation. It will be apparent to those skilled in the art that modifications and variations can be made. For instance, features illustrated or described as part of one embodiment may be used in another embodiment to yield a still further embodiment. Thus, it is intended that this disclosure include modifications and variations as come within the scope of the appended claims and their equivalents.

Illustrative Example of a Device for Providing Simulated Physical Interactions with Haptic Effects Designers often leverage user experience with physical interactions to make digital interfaces more efficient and pleasant to use. This is generally done by reproducing some aspects of interactions with the physical world through visual and/or audio feedback. These types of interactions can be particularly powerful on touchscreens. In some embodiments, Electrostatic Friction (ESF) feedback can be used to increase the realism and usability of simulated physical interactions in touch-sensitive systems. For example, in some embodiments of the present disclosure ESF or actuators can be used to output realistic tactile feedback to partially reproduce the sensations associated with a physical interaction. Further, in some embodiments, abstract tactile feedback is also possible with ESF or actuators.

One illustrative embodiment of the present disclosure comprises a computing system such as a smartphone, tablet, or portable music device. The computing system can include and/or may be in communication with one or more sensors, such as an accelerometer, as well as sensors (e.g., optical, resistive, or capacitive) for determining a location of a touch relative to a display area corresponding in this example to the screen of the device.

As the user interacts with the device, one or more haptic output devices, for example, actuators are used to provide tactile effects. For example, a haptic effect may be configured to change the coefficient of friction perceived by the user when moving his or her finger across the surface of the device. In one such embodiment, as the user's finger moves across the surface, a vibration, electric field, or other effect may be output to change the coefficient of friction felt by the user. Depending on how the friction is varied, the user may perceive a feature in the touch surface that would not otherwise be perceived in the same manner (or at all) if the surface friction were not varied. As a particular example, the friction may be varied so that the user perceives a bump, border, or other obstacle corresponding to an edge of a feature, for example, an on-screen widget such as a virtual button, slider, knob, or other interface. In some embodiments, this widget may be configured to control a system associated with the widget. For example, in one embodiment, the widget may comprise a virtual knob configured to control a temperature. Thus, by interacting with the virtual knob, a user may be able to adjust temperature settings.

In other embodiments, a haptic effect of the type described above may be output to simulate one of many potential effects. For example, in one embodiment, a device may display a virtual desktop. In such an embodiment, as the user interacts with various features of the virtual desktop, the user may feel effects associated with the items on the desktop. For example, in such an embodiment, as the user interacts with a stack of papers on the virtual desktop, the user may feel a haptic effect, such as a variance in the texture or friction. For example, in one such embodiment, as the user interacts with a virtual stack of papers, the device may output a haptic effect that increases the friction the user feels as the papers rub against each other. Similarly, in such an embodiment, the display may show a visual effect that corresponds to the haptic effect, e.g., the display may show the stack of papers moving as the user interacts with it. In a further embodiment, as the user pushes the stack of papers, the device may output a haptic effect associated with the stack of papers falling over. Similarly, in such an embodiment, the display may show images associated with the stack of papers falling over.

Haptic effects of the type described above may be used in further embodiments as well. For example, in one embodiment, the user may be playing a video game on a device. In such an embodiment, the device may output a haptic effect associated with the action the user takes. For example, in one such embodiment, the user may move a character in a video game across the screen. In such an embodiment, the device may output a haptic effect configured to simulate a variance in the texture the character in the game may be passing over. Similarly, in such an embodiment, the device may vary the friction the user feels as he or she moves the character across different surfaces in the character's virtual world. For example, in one embodiment, as the user moves a character over a rough surface, the device may output a haptic effect configured to increase the coefficient of friction the user feels moving his or her finger across the surface of the display. In another embodiment, the user may play a game associated with a virtual slingshot. In such an embodiment, as the user tightens the virtual slingshot the device may output a haptic effect configured to simulate the increased tension. In one such embodiment, this haptic effect may comprise an effect configured to increase the coefficient of friction the user feels as the user moves his or her finger across the surface of the screen to tighten the slingshot.

Further, in some embodiments, the device may vary the coefficient of friction, or output an effect configured to simulate a texture, to provide the user with confirmation that a gesture is available. For example, in one embodiment as the user moves a finger across the surface of the touch screen the user may pass over a button, slider, or other input device on the surface of the touch screen. As the user's finger passes over this input device the device may output a haptic effect configured to vary the coefficient of friction or simulate a texture to let the user know that his or her finger has passed over an input device. For example, in one embodiment, as the user's finger moves over top of a button, the device may output a haptic effect configured to increase the coefficient of friction to let the user know that his or her finger has passed over a button.

Further, in some embodiments, the device may increase the coefficient of friction, or output an effect configured to simulate a texture, to provide the user with confirmation that different types of interaction can be used to control a simulated input device (e.g., a button, switch, slider, or other input device on the touch screen display). For example, in one embodiment, as a user moves his or her finger across the surface of the touch screen, the user may feel a button as discussed above. And further, the device may output a haptic effect configured to identify that a certain operation is available. For example, in one embodiment, the device may output a texture that indicates lifting the finger off the button will activate it. In another embodiment, as the user moves a finger across the surface of the touch screen he or she feels and edge of a slider. In such an embodiment, as the user moves a finger over the slider, the device may output an effect configured to vary the perceived coefficient of friction, or simulating a texture, to indicate that the slider can be activating by swiping. In still other embodiments, a haptic effect may be used to identify a certain interaction is not available. For example, in one embodiment, when the user moves his or her finger over a section of the touch screen associated with a button that is not currently active, the device may output a haptic effect (e.g., an effect configured to simulate a dull texture) to let the user know that the button is not currently active.

Similarly, in some embodiments, an item on the touch screen may have an associated haptic effect to identify its importance. For example, in one embodiment, a virtual input device such as a button may have a more important operation than other virtual input devices. For example, in one embodiment, the button may be associated with turning off the device or placing the device in an "airplane mode." In other embodiments, the device may use other indicators of importance. For example, in one embodiment, the user may be viewing a news application on the device. In such an embodiment, the device may be configured to apply a simulated texture or varied coefficient of friction associated with headlines. Similarly, if the user receives a message that has been marked with "high importance" the device may be configured to associate a simulated texture or coefficient of friction with this message.

In other embodiments, a simulated texture or variance in the coefficient of friction may be used to provide confirmation of an action or activation of a mode. For example, as the user makes various gestures on a touch pad or touch screen, the device may vary the coefficient of friction or simulate a texture to indicate that the gesture has been received. For example, in one embodiment, a simulated texture or variance in the coefficient of friction may be associated with a pinch to zoom gesture. In such an embodiment, when the device detects a pinch to zoom gesture, it may output an effect configured to simulate a texture or variance in the coefficient of friction to confirm that the gesture has been received. In another embodiment, a simulated texture or variance in the coefficient of friction may be output to confirm receipt of a four finger gesture to return to the home screen. In still other embodiments, a simulated texture or variance in the coefficient of friction may be associated with gestures such as scrolling left/right, or up/down. In some embodiments, this may enable the user to use multiple gestural interactions with the device in rapid succession, as the simulated texture or variance in the coefficient of friction will identify that the interaction has been received so the user can immediately move on to the next interaction.

Further, in some embodiments, a simulated texture or variance in the coefficient of friction may be associated with specific device operations, for example, sending a call to voice mail, sending a text message, sending an email, downloading an update, some operation associated with a game or application, or some other operation. Similarly, in some embodiments, a simulated texture or variance in the coefficient of friction may be associated with a system under the control of the device. For example, in one embodiment, the device may be configured to control a climate control system. In such an embodiment, when the user interacts with a widget in the user interface, the user may be able to control, for example, a temperature setting or a fan setting. Similarly, in such an embodiment, when the user interacts with the widget, the device may output a simulated texture or variance in the coefficient of friction to confirm the user input has been received or that the system is being controlled.

As will be discussed in further detail below, simulating a texture on a surface or varying the coefficient of friction can be used in any number of ways to provide information to a user. Additionally, the presence of a feature in the touch surface can be simulated using effects in addition to or instead of simulating a texture or varying the coefficient of friction. Similarly, a haptic effect can be output to simulate the feeling of a texture on a surface of the device other than the display.

Illustrative Systems for Providing Simulated Physical Interactions with Haptic Effects FIG. 1A shows an illustrative system 100 for providing simulated physical interactions with haptic effects. In this example, system 100 comprises a computing device 101 having a processor 102 interfaced with other hardware via bus 106. A memory 104, which can comprise any suitable tangible (and non-transitory) computer-readable medium such as RAM, ROM, EEPROM, or the like, embodies program components that configure operation of the computing device. In this example, computing device 101 further includes one or more network interface devices 110, input/output (I/O) interface components 112, and additional storage 114.

Network device 110 can represent one or more of any components that facilitate a network connection. Examples include, but are not limited to, wired interfaces such as Ethernet, USB, IEEE 1394, and/or wireless interfaces such as IEEE 802.11, BLUETOOTH ®, or radio interfaces for accessing cellular telephone networks (e.g., transceiver/antenna for accessing a CDMA, GSM, UMTS, or other mobile communications network).

I/O components 112 may be used to facilitate connection to devices such as one or more displays, keyboards, mice, speakers, microphones, and/or other hardware used to input data or output data. Storage 114 represents nonvolatile storage such as magnetic, optical, or other storage media included in device 101.

System 100 further includes a touch surface 116, which, in this example, is integrated into device 101. Touch surface 116 represents any surface that is configured to sense tactile input of a user. One or more sensors 108 are configured to detect a touch in a touch area when an object contacts a touch surface and provide appropriate data for use by processor 102. Any suitable number, type, or arrangement of sensors can be used. For example, resistive and/or capacitive sensors may be embedded in touch surface 116 and used to determine the location of a touch and other information, such as pressure. As another example, optical sensors with a view of the touch surface may be used to determine the touch position. In some embodiments, sensor 108 and touch surface 116 may comprise a touch-screen or a touch-pad. For example, in some embodiments, touch surface 116 and sensor 108 may comprise a touch-screen mounted overtop of a display configured to receive a display signal and output an image to the user. In other embodiments, the sensor 108 may comprise an LED detector. For example, in one embodiment, touch surface 116 may comprise an LED finger detector mounted on the side of a display. In some embodiments, the processor is in communication with a single sensor 108, in other embodiments, the processor is in communication with a plurality of sensors 108, for example, a first touch-screen and a second touch screen. The sensor 108 is configured to detect user interaction, and based on the user interaction, transmit signals to processor 102. In some embodiments, sensor 108 may be configured to detect multiple aspects of the user interaction. For example, sensor 108 may detect the speed and pressure of a user interaction, and incorporate this information into the interface signal.

In this example, a haptic output device 118 in communication with processor 102 is coupled to touch surface 116. In some embodiments, haptic output device 118 is configured to output a haptic effect simulating a texture on the touch surface in response to a haptic signal. Additionally or alternatively, haptic output device 118 may provide vibrotactile haptic effects that move the touch surface in a controlled manner. Some haptic effects may utilize an actuator coupled to a housing of the device, and some haptic effects may use multiple actuators in sequence and/or in concert. For example, in some embodiments, a surface texture may be simulated or the perceived coefficient of friction may be varied (e.g., reduced or increased) by vibrating the surface at different frequencies. In such an embodiment haptic output device 118 may comprise one or more of, for example, a piezoelectric actuator, an electric motor, an electromagnetic actuator, a voice coil, a shape memory alloy, an electro-active polymer, a solenoid, an eccentric rotating mass motor (ERM), or a linear resonant actuator (LRA). In some embodiments, haptic output device 118 may comprise a plurality of actuators, for example, an ERM and an LRA.

Although a single haptic output device 118 is shown here, embodiments may use multiple haptic output devices of the same or different type to simulate surface textures on the touch surface. For example, in one embodiment, a piezoelectric actuator may be used to displace some or all of touch surface 116 vertically and/or horizontally at ultrasonic frequencies, such as by using an actuator moving at frequencies greater than 20 kHz in some embodiments. In some embodiments, multiple actuators such as eccentric rotating mass motors and linear resonant actuators can be used alone or in concert to provide different textures and other haptic effects.

In still other embodiments, haptic output device 118 may use electrostatic attraction, for example by use of an electrostatic surface actuator, to simulate a texture on the surface of touch surface 116 or to vary the coefficient of friction the user feels when moving his or her finger across touch surface 116. For example, in one embodiment, haptic output device 118 may comprise an electrovibrotactile display or any other device that applies voltages and currents instead of mechanical motion to generate a haptic effect. In such an embodiment, the electrostatic actuator may comprise a conducting layer and an insulating layer. In such an embodiment, the conducting layer may be any semiconductor or other conductive material, such as copper, aluminum, gold, or silver. And the insulating layer may be glass, plastic, polymer, or any other insulating material. Furthermore, the processor 102 may operate the electrostatic actuator by applying an electric signal to the conducting layer. The electric signal may be an AC signal that, in some embodiments, capacitively couples the conducting layer with an object near or touching touch surface 116. In some embodiments, the AC signal may be generated by a high-voltage amplifier. In other embodiments the capacitive coupling may simulate a friction coefficient or texture on the surface of the touch surface 116. For example, in one embodiment, the surface of touch surface 116 may be smooth, but the capacitive coupling may produce an attractive force between an object near the surface of touch surface 116. In some embodiments, varying the levels of attraction between the object and the conducting layer can vary the simulated texture on an object moving across the surface of touch surface 116. Furthermore, in some embodiments, an electrostatic actuator may be used in conjunction with traditional actuators to vary the simulated texture on the surface of touch surface 116. For example, the actuators may vibrate to simulate a change in the texture of the surface of touch surface 116, while at the same time; an electrostatic actuator may simulate a different texture on the surface of touch surface 116.

One of ordinary skill in the art will recognize that, in addition to varying the coefficient of friction, other techniques or methods can be used to simulate a texture on a surface. For example, in some embodiments, a texture may be simulated or output using a flexible surface layer configured to vary its texture based upon contact from a surface reconfigurable haptic substrate (including, but not limited to, e.g., fibers, nanotubes, electroactive polymers, piezoelectric elements, or shape memory allows) or a magnetorheological fluid. In another embodiment, surface texture may be varied by raising or lowering one or more surface features, for example, with a deforming mechanism, air or fluid pockets, local deformation of materials, resonant mechanical elements, piezoelectric materials, micro-electromechanical systems ("MEMS") elements, thermal fluid pockets, MEMS pumps, variable porosity membranes, or laminar flow modulation.

In some embodiments, an electrostatic actuator may be used to generate a haptic effect by stimulating parts of the body or objects near or touching touch surface 116. For example, in some embodiments, an electrostatic actuator may stimulate the nerve endings in the skin of a user's finger or components in a stylus that can respond to the electrostatic actuator. The nerve endings in the skin, for example, may be stimulated and sense the electrostatic actuator (e.g., the capacitive coupling) as a vibration or some more specific sensation. For example, in one embodiment, a conducting layer of an electrostatic actuator may receive an AC voltage signal that couples with conductive parts of a user's finger. As the user touches the touch surface 116 and moves his or her finger on the touch surface, the user may sense a texture of prickliness, graininess, bumpiness, roughness, stickiness, or some other texture.

Turning to memory 104, illustrative program components 124, 126, and 128 are depicted to illustrate how a device can be configured in some embodiments to provide simulated physical interactions with haptic effects. In this example, a detection module 124 configures processor 102 to monitor touch surface 116 via sensor 108 to determine a position of a touch. For example, module 124 may sample sensor 108 in order to track the presence or absence of a touch and, if a touch is present, to track one or more of the location, path, velocity, acceleration, pressure and/or other characteristics of the touch over time.

Haptic effect determination module 126 represents a program component that analyzes data regarding touch characteristics to select a haptic effect to generate. Particularly, module 126 may comprises code that determines, based on the location of the touch, a haptic effect to output to the surface of the touch surface and code that selects one or more haptic effects to provide in order to simulate the effect. For example, some or all of the area of touch surface 116 may be mapped to a graphical user interface. Different haptic effects may be selected based on the location of a touch in order to simulate the presence of a feature by simulating a texture on a surface of touch surface 116 so that the feature is felt when a corresponding representation of the feature is seen in the interface. However, haptic effects may be provided via touch surface 116 even if a corresponding element is not displayed in the interface (e.g., a haptic effect may be provided if a boundary in the interface is crossed, even if the boundary is not displayed).

Haptic effect generation module 128 represents programming that causes processor 102 to generate and transmit a haptic signal to actuator 118 to generate the selected haptic effect at least when a touch is occurring. For example, generation module 128 may access stored waveforms or commands to send to haptic output device 118. As another example, haptic effect generation module 128 may receive a desired type of texture and utilize signal processing algorithms to generate an appropriate signal to send to haptic output device 118. As a further example, a desired texture may be indicated along with target coordinates for the texture and an appropriate waveform sent to one or more actuators to generate appropriate displacement of the surface (and/or other device components) to provide the texture. Some embodiments may utilize multiple haptic output devices in concert to simulate a feature. For instance, a variation in texture may be used to simulate crossing a boundary between a button on an interface while a vibrotactile effect simulates the response when the button is pressed.

Figure 1B:
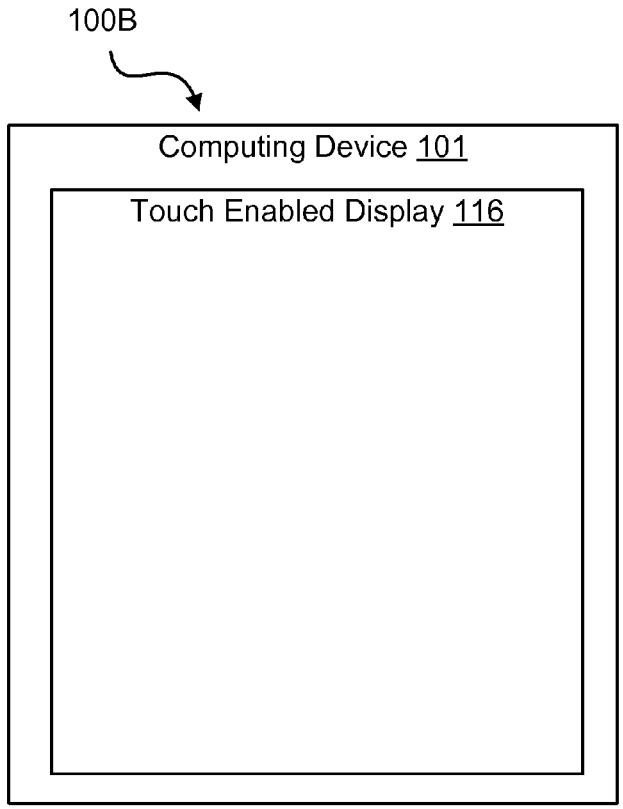
FIG. 1B shows an external view of one embodiment of the system shown in FIG. 1A.

A touch surface may or may not overlay (or otherwise correspond to) a display, depending on the particular configuration of a computing system. In FIG. 1B, an external view of a computing system 100B is shown. Computing device 101 includes a touch enabled display 116 that combines a touch surface and a display of the device. The touch surface may correspond to the display exterior or one or more layers of material above the actual display components.

Figure 1C:
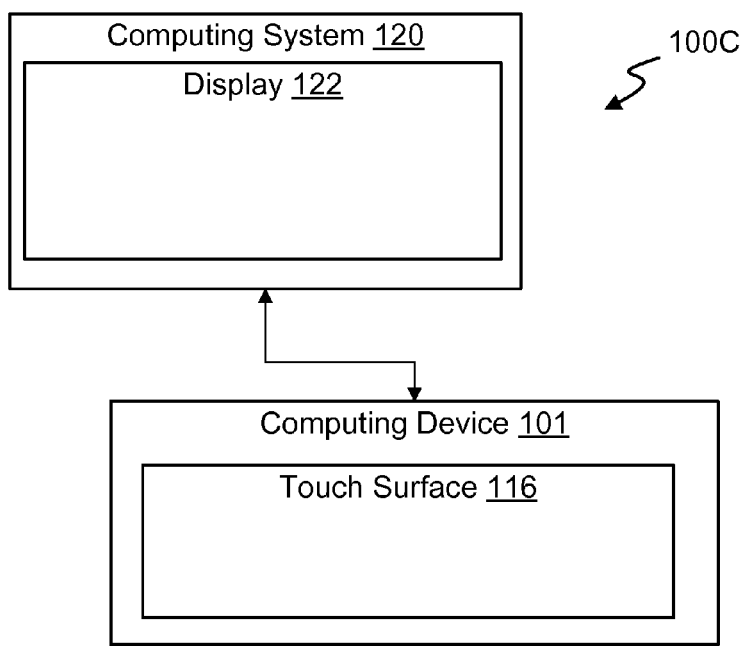
FIG. 1C illustrates an external view of another embodiment of the system shown in FIG. 1A.

FIG. 1C illustrates another example of a touch enabled computing system 100C in which the touch surface does not overlay a display. In this example, a computing device 101 comprises a touch surface 116 which may be mapped to a graphical user interface provided in a display 122 that is included in computing system 120 interfaced to device 101. For example, computing device 101 may comprise a mouse, trackpad, or other device, while computing system 120 may comprise a desktop or laptop computer, set-top box (e.g., DVD player, DVR, cable television box), or another computing system. As another example, touch surface 116 and display 122 may be disposed in the same device, such as a touch enabled trackpad in a laptop computer comprising display 122. Whether integrated with a display or otherwise, the depiction of planar touch surfaces in the examples herein is not meant to be limiting. Other embodiments include curved or irregular touch enabled surfaces that are further configured to provide surface-based haptic effects.

Figure 2A:
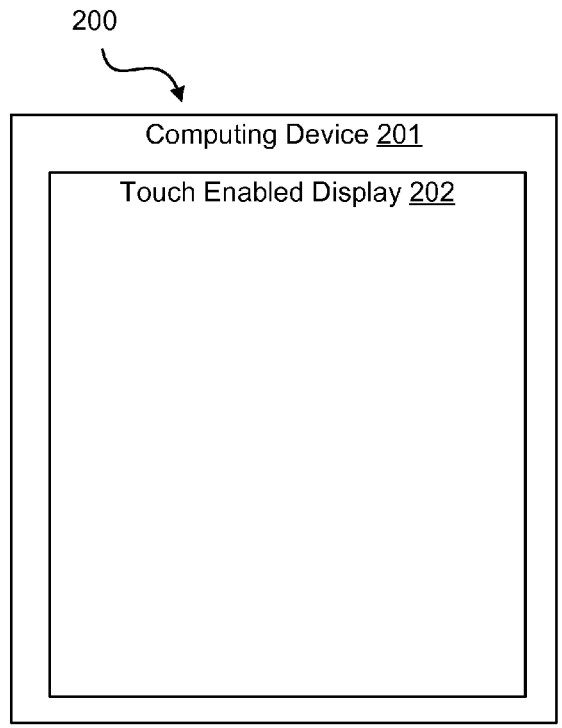
FIGS. 2A-2B illustrate an example embodiment for simulated physical interactions with haptic effects.
Figure 2B:
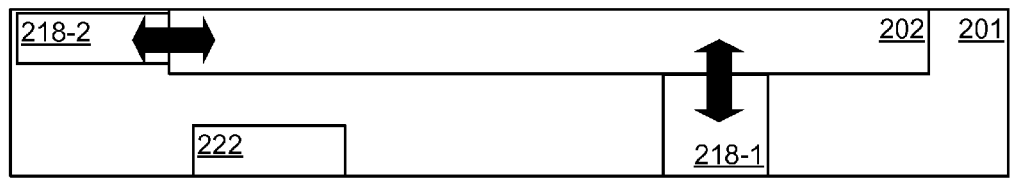

FIGS. 2A-2B illustrate an example embodiment of systems and methods for simulated physical interactions with haptic effects. FIG. 2A is a diagram illustrating an external view of a system 200 comprising a computing device 201 that comprises a touch enabled display 202. FIG. 2B shows a cross-sectional view of device 201. Device 201 may be configured similarly to device 101 of FIG. 1A, though components such as the processor, memory, sensors, and the like are not shown in this view for purposes of clarity.

As can be seen in FIG. 2B, device 201 comprises a plurality of haptic output devices 218 and an additional haptic output device 222. Haptic output device 218-1 may comprise an actuator configured to impart vertical force to display 202, while 218-2 may move display 202 laterally. In this example, the haptic output devices 218, 222 are coupled directly to the display, but it should be understood that the haptic output devices 218, 222 could be coupled to another touch surface, such as a layer of material on top of display 202. Furthermore it should be understood that one or more of haptic output devices 218 or 222 may comprise an electrostatic actuator, as discussed above. Furthermore, haptic output device 222 may be coupled to a housing containing the components of device 201. In the examples of FIGS. 2A-2B, the area of display 202 corresponds to the touch area, though the principles could be applied to a touch surface completely separate from the display.

In one embodiment, haptic output devices 218 each comprise a piezoelectric actuator, while additional haptic output device 222 comprises an eccentric rotating mass motor, a linear resonant actuator, or another piezoelectric actuator. Haptic output device 222 can be configured to provide a vibrotactile haptic effect in response to a haptic signal from the processor. The vibrotactile haptic effect can be utilized in conjunction with surface-based haptic effects and/or for other purposes. For example, each actuator may be used in conjunction to simulate a texture on the surface of display 202.

In some embodiments, either or both haptic output devices 218-1 and 218-2 can comprise an actuator other than a piezoelectric actuator. For example, haptic output devices 218-1 and 218-2 may comprise a piezoelectric actuator, an electromagnetic actuator, an electroactive polymer, a shape memory alloy, a flexible composite piezo actuator (e.g., an actuator comprising a flexible material), electrostatic, and/or magnetostrictive actuators, for example. Additionally, haptic output device 222 is shown, although multiple other haptic output devices can be coupled to the housing of device 201 and/or haptic output devices 222 may be coupled elsewhere. Device 201 may feature multiple haptic output devices 218-1/218-2 coupled to the touch surface at different locations, as well.

Figure 3A:
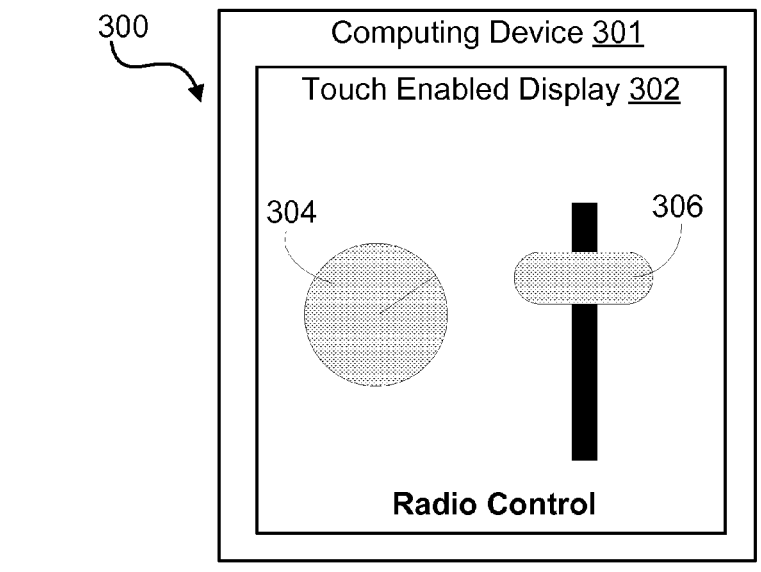
FIG. 3A depicts an illustrative system for simulated physical interactions with haptic effects.

Turning to FIG. 3A, system 300 is an illustrative example of simulated physical interactions with haptic effects. FIG. 3A is a diagram illustrating an external view of a system 300 comprising a computing device 301 that comprises a touch enabled display 302. In one embodiment, computing device 301 may comprise a multifunction controller. For example, a controller for use in a kiosk, ATM, automobile, airplane, thermostat, or other type of computing device. In another embodiment, the computing device may comprise a smartphone, tablet, or other type of computer. In one embodiment, computing device 301 may be configured to control a music player. In such an embodiment, computing device 301 may comprise one or more virtual controllers on display 302. These controllers may be associated with functions of a music player, thus the user may interact with the controllers to control functions of the music player. For example, in the embodiment shown in FIG. 3A, the computing device 301 comprises one or more widgets or virtual interfaces, shown in FIG. 3A as controller 304 and controller 306. In such an embodiment, controller 304 may comprise an image of a knob configured to control settings of the music player, e.g., a knob to tune to a radio station, select a new song, or adjust the volume. Similarly, controller 306 may comprise an image of a slider configured to adjust another feature of the music player. In other embodiments, computing device 301 may comprise a plurality of other virtual controllers on touch enabled display, each of the virtual controllers configured to control other aspects of a system, for example, a music player or other system.

In the embodiment described above, computing device 301 may be used to output music from a music player application to a car stereo, or be a component of the stereo itself. In such an embodiment, the user may be a driver who does not want to take his or her eyes off the road in order to adjust settings on the music player application. In such an embodiment, computing device 301 may implement a haptic effect to allow the user to identify the available functions without having to visually focus on touch enabled display 302. For example, in one embodiment, device 301 may use a haptic output device to simulate a texture on the surface of touch enabled display 302. In such an embodiment, the haptic output device may output a haptic effect configured to simulate the texture of, for example, gravel, sand, sandpaper, felt, leather, metal, ice, water, grass, or another object. Based on this texture, the user may be able to determine what type of system or device the computing device 301 is currently controlling. For example, in one embodiment, the user may know that one texture, e.g., the texture of gravel, is associated with music player controls. In such an embodiment, when the user feels the texture of gravel on the surface of touch enabled display, the user knows that computing device 301 is currently controlling the volume of the music player, without having to look at the controls. In a further embodiment, the user may be able to assign a texture to various modes that computing device 301 may control. Thus, for example, the user may be able to select a particular texture that will be associated with various functions that computing device 301 may control.

In a further embodiment, computing device 301 may further output another haptic effect when the user touches or moves each of controllers 304 and 306. For example, in one embodiment, controller 304 may comprise a knob 304. In such an embodiment, when the user interacts with the knob 304, the user may feel a certain haptic effect configured to let the user know that he or she is touching knob 304. For example, in one embodiment, knob 304 may have a texture that differs from the texture of the background on touch-enabled display 302. Thus, the user may run his or her finger over touch enabled display, and know by the change in texture that he or she is touching knob 304. In still another embodiment, computing device 301 may output a different texture as the user adjusts knob 304. For example, in one embodiment, knob 304 may control the volume of an audio output system. In such an embodiment, computing device 301 may adjust the simulated texture on the surface of touch enabled display 302 as the user adjusts the volume. Thus, for example, as the user increases the volume, the computing device 301 may output a haptic effect configured to simulate a texture on the surface of touch enabled display 302, which becomes coarser. In some embodiments, such a haptic effect may serve as a confirmation that the computing device 301 has received the user input.

Similarly, in some embodiments, haptic effects of the type described above may be used to simulate toggle switches. For example, in one embodiment, controller 306 may comprise a toggle switch rather than a slider. In such an embodiment, the toggle switch may toggle between two states as a finger slides against the touch enabled display 302. In some embodiments, a haptic effect associated with the state transition may be output, for example, by outputting a pulse of electrostatic feedback during the state transition. In another embodiment, the gradual rocking of the switch may also simulated by outputting a haptic effect configured to simulate a texture of increasing intensity that drops abruptly once the state changes.

In some embodiments, a toggle switch may be represented in touch enabled display 302 as a button that slides horizontally against a track. In some embodiments, such a button may be configured to be dragged horizontally such that it moves to the alternate position. In some embodiments, the button may be configured to move or "snap" into the closest rest position when released. In some embodiments, the button may be captured by either interacting with an area of touch enabled display 302, for example, by touching the area directly associated with the button, or by touching within a larger area around the button. In such an embodiment, the button may then move by an amount corresponding to the horizontal movement of the finger until the button has reached its maximum travel. A sliding toggle could similarly be implemented in the vertical direction.

In some embodiments, the toggle produces tactile feedback as the button is dragged by the user interaction. In some embodiments, when the toggle is sliding a processor may output a signal to a haptic output device, the signal comprising a 50-Hz square wave at 100% intensity when active and a 200-Hz sinusoidal at 50% intensity when inactive. In some embodiments, these variations in signals may be felt by the user as a variation in texture. Further, in some embodiments these signals may comprise a higher or lower frequency and another shape wave, e.g., a saw tooth wave, a random wave, a white noise wave, or a pink noise wave. In some embodiments, the signal changes halfway through the operating as the widget is toggled to the left or right. In some embodiments, this signal change may be associated with a transition effect, as the widget moves from one state (e.g., on) to another (e.g., off). In some embodiments, the signal may be disabled once the widget has reached its maximum travel. In some embodiments, at the point of maximum travel of the widget, the computing device may output an effect associated with an impact.

In some embodiments, the haptic effect could be implemented in several ways. For example, in one embodiment, computing device 301 may output ESF in brief pulses as a widget reaches the middle of its travel range. In some embodiments, this may serve as an indication that the widget has toggled to the alternate state. In some embodiments, computing device 301 may also be configured to output a uniform temporal texture that it may briefly interrupt at the point of toggle.

Further, in some embodiments, the visual appearance of a virtual toggle switch may vary, for example, in some embodiments; a virtual toggle switch may comprise an appearance similar to that of physical switches used in car dashboards and other interfaces. In some embodiments, computing device 301 may be configured to output haptic effects that are tuned to match the physical model and visual appearance of the switch. For example, in one embodiment, the bi-stable nature of a switch could be reinforced by displaying the moving parts of the switch as moving slower than the finger pressing the touch enabled display 302 at the location of the switch. In such an embodiment, the switch could then visually abruptly catch up as the toggle point is reached. Further, in such an embodiment, the intensity of the haptic effect may be configured to match this slow build-up of force against the moving part.

In some embodiments, another haptic rendering may be used to indicate toggles between two states. In such an embodiment, the amplitude or frequency of a periodic driving signal may be modulated as a function of the position of a sliding gesture or current switch state. Further, in some embodiments, a selected parameter (e.g., the frequency, amplitude, pulse width, or pulse shape) of the periodic driving signal may be increased gradually as the switch or slider is progressively activated. In one embodiment the selected parameter may reach its maximum as the switch or slider reaches its toggling threshold. In some embodiments, the parameter may then drop abruptly to a lower value as the threshold is crossed and the toggle takes place. In another embodiment, the parameter may remain at the lower value as the switch or slider activation continues to increase. In some embodiments, if the activation reverses course, the parameter may increase linearly with a slope such that the maximum may be reached at the same time the switch or slider reaches a threshold in reverse direction. In some embodiments, the parameter may then drop again to a minimal value as the threshold is crossed. Further, in such an embodiment, the same process may be repeated until the gesture ends, e.g., when the user lifts his or her finger off the surface.

Further, in some embodiments systems and methods for simulated physical interactions with haptic effects may be used to simulate spring loaded buttons. For example, in one embodiment, controller 306, shown in FIG. 3A, may comprise a virtual spring loaded button. In such an embodiment, the virtual spring loaded button 306 may be used as a fast-forward button, for example, in a video or audio player application. Further, in some embodiments, although visually similar to a sliding toggle, a spring-loaded button 306 may return to its rest position when released, simulating the operation of a switch attached to, for example, a spring.

In some embodiments, a virtual spring loaded button 306 is operated by dragging a sliding button vertically (in some embodiments, not shown in FIG. 3A, a virtual spring loaded button may be moved in another direction, e.g., horizontal, diagonal, or in a non-linear direction, e.g., away from center). In some embodiments, the spring loaded button 306 stops moving once the travel limit has been reached. In some embodiments engaging the button reveals a background color, suggesting activation of the button. In another embodiment, a spring-like mechanism could instead be displayed and animated. In some embodiments, this could for example take the form of an accordion-like structure, a coiled spring or a textured material that extends as the button is engaged.

In some embodiments, as the user interacts with the spring loaded button 306, the tactile feedback simulates the presence of a spring and its resistance. In one such embodiment, a 50-ms pulse signal may be output to a haptic output device when the user first interacts with the spring loaded button to simulate a contact. Further, in such an embodiment, this may be followed by a weighted superposition of a 100 Hz and 200 Hz square wave to a haptic output device. In some embodiments, this may simulate a low frequency texture decreasing in magnitude and a high frequency texture increasing in magnitude as the button is engaged. In some embodiments, this may simulate a sensation throughout the spring's extension. Further, in some embodiments, the sensation may be interpreted as an increase in resistance the user feels when moving the virtual spring loaded button 306. In some embodiments, this resistance is produced only while moving the virtual spring loaded button 306 in one direction, e.g., moving the button upward in the embodiment shown in FIG. 3A (or in embodiments not shown in FIG. 3A, to the left or right). In such an embodiment, the user may feel no effect when moving the virtual spring loaded button in the opposite direction, e.g., down in the embodiment shown in FIG. 3A (or in embodiments not shown in FIG. 3A, to the left or right or other directions). Further, in some embodiments, other variations of this tactile feedback may be used, for example, in one embodiment, as the user interacts with the virtual spring loaded button 306, the user may feel a single temporal texture of increasing intensity.

In other embodiments, effects of the type discussed above could be applied to other buttons or widgets. For example, in some embodiments, controller 304 may comprise a jog dial 304. In such an embodiment, the jog dial 304 could comprise a combination of the effects found in regular dials (e.g., detents) as well a resistance as found in spring-loaded buttons. Similarly, effects of the type discussed above could be applied to push buttons, for example for texture and edge effects for discovery. In still other embodiments, effects of the type discussed above could be applied to header tabs. For example, tabs to change between modes of operation (header tabs are discussed in further detail below with regard to FIG. 4B).

In another embodiment, haptic feedback such as electrostatic feedback or high frequency vibrations may be used to replicate the resistance of physical sliders as well as detents and stops. Similarly, in one embodiment, a joystick may be simulated by using haptic feedback to simulate the presence of centering force. In some embodiments, this force may be simulated by outputting haptic signals that may oscillate at an increasing intensity.

Figure 3B:
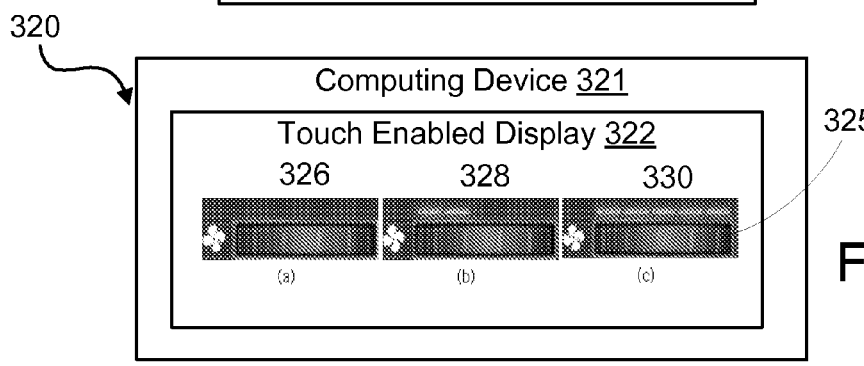
FIG. 3B depicts an illustrative system for simulated physical interactions with haptic effects.

Turning now to FIG. 3B, FIG. 3B shows an illustrative system for simulated physical interactions with haptic effects. As shown in FIG. 3B illustrating an external view of a system 320 comprising a computing device 321 that comprises a touch enabled display 322. In the embodiment shown in FIG. 3B, computing device 321 may comprise an embodiment of computing device 301 described with regard to FIG. 3A. As shown in FIG. 3B System 320 comprises a virtual linear slider 325. A virtual linear slider 325 may allow adjustments to a continuous parameter through linear motion. In some embodiments, a slider may be configured to control one or more device. For example, in some embodiments, a virtual linear slider 325 may be configured to control the airflow from a car's ventilation system, an audio system (e.g., volume, track selection, location within a track, or features associated with the audio output, etc.), or a video system (e.g., video selection, location within the video, playback speed, etc.)

In some embodiments instead of responding to angular motion the linear slider 325 responds to linear motion. In such an embodiment, the linear slider 325 therefore operates based on distance travelled instead of degrees travelled. In some embodiments, the linear slider 325 may be operated by interacting with a predefined area of a touch enabled display. In some embodiments, this area may be a rectangle extending slightly past the linear slider 325. A user may interact with the linear slider, by dragging an object associated with the linear slider (e.g., a wheel) horizontally to the left or right. In some embodiments, the wheel can optionally keep moving based on horizontal travel even after the user is no longer interacting with the object. In some embodiments, this movement may simulate the momentum of the virtual linear slider 325.

In some embodiments, as shown in FIG. 3B, turning the object (a wheel displayed on touch enabled display 322 in the embodiment shown in FIG. 3B) causes sets of indicator lights to turn on. For example, in the embodiment shown in FIG. 3B, linear slider 325 is shown in three positions 326, 328, and 330. In the embodiment shown in FIG. 3B, each of these positions comprises a different configuration of indicator lights. In some embodiments, these indicator lights may be associated with a measurement associated with the movement of linear slider, e.g., a level of airflow, audio volume, or a location in the playback of a movie, depending on what type of device is associated with virtual linear slider 325.

In some embodiments, a wheel associated with a linear slider of the type shown in FIG. 3B may further comprise a plurality of tick marks. In some embodiments, as the user interacts with the wheel, the user may feel a haptic effect configured to simulate the movement of the wheel or interaction with these tick marks. For example, in one embodiment, a virtual linear slider 325 may produce haptic feedback similar to that of controllers 304 and 306 described above with regard to FIG. 3A. In other embodiments, a haptic output device may output effects configured to simulate detents as the user interacts with virtual linear slider 325. In such an embodiment, these detents may be associated with 45-pixel pulses that depend on the linear displacement. Further, in some embodiments the detents can be designed so as to match visual detents in density and location as the virtual linear slider 325 is moved.

Figure 3C:
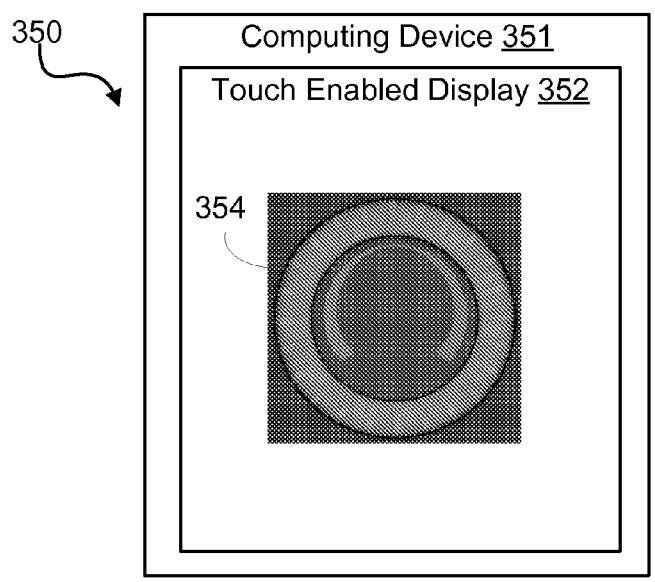
FIG. 3C depicts an illustrative system for simulated physical interactions with haptic effects.

Turning to FIG. 3C, FIG. 3C shows system 350, which comprises a computing device 351 that comprises a touch enabled display 352. In the embodiment shown in FIG. 3C, computing device 301 may comprise one embodiment of computing device 301 described with regard to FIGS. 3A and 3B.

In some embodiments, haptic effects of the type described herein may be used to simulate haptic effects associated with a "continuous widget." A continuous widget may be, for example, a dial, which in some embodiments may be similar to the virtual interfaces described above with regard to FIGS. 3A and 3B.

The system 350 shown in FIG. 3B comprises virtual dial 354. In some embodiments, a user may use a circular gesture on the surface of touch enabled display 352 to control a parameter associated with virtual dial 354. In some embodiments, this parameter may comprise, for example, a temperature parameter on a thermostat controlled by a computing device (e.g., the thermostat on a car's climate control), a volume parameter, a brightness parameter, a speed parameter (e.g., the speed of playback of an audio or video file), or some other parameter that may be controlled by a dial.

In one embodiment, a user may interact with virtual dial 354. In such an embodiment, based on the user's interaction, the virtual dial 354 may turn as the user's finger makes a circular gesture around virtual dial 354's center. In some embodiments, the angular displacement of virtual dial 354, e.g., a touch input rotation of θ around the virtual dial 354's center, results in an equivalent rotation of θ of virtual dial 354. In another embodiment, the rotation of virtual dial 354 may track the rotation of the user's finger around a dynamic center such that the gesture can drift away from the virtual dial 354, as might happen, for example, if the user becomes distracted and looks away from touch enabled display 352. In some embodiments this may involve, for example, continuously estimating the center of the circular gesture based on an estimate of the current gesture curvature. Similarly, the direction of rotation may be estimated based on curvature and detection of reversals.

In some embodiments, virtual dial 354 may be visually represented as a disc rising out of a surface of touch enabled display 352. In some embodiments, the outer rim of a virtual dial 354 may be covered with tick marks, and its center may comprise indicators associated with the turning of virtual dial 354. For example, in one embodiment, the center of virtual dial 354 may comprise red and blue arcs that vary in color as virtual dial 354 is turned. In such an embodiment, virtual dial 354 may gradually change color from bright blue to gray as the dial is rotated in one direction, and then gradually become red as the dial continues to be rotated. In such an embodiment, the dial may be associated with a thermostat for temperature control, and the color indication may be associated with the temperature setting. In other embodiments, this visual representation could be substituted by other depictions of dials, either based on physical controls or abstractions.

In some embodiments, virtual dial 354 may comprise a limited range of travel, e.g., a limited number of rotations (e.g., four turns). In such an embodiment, when the range of travel is exceeded, the system may no longer be controlled by the virtual dial 354 (e.g., the temperature, volume, etc., no longer changes). Further, in some embodiments, when the range of travel is exceeded the virtual dial 354 may stop tracking the rotation of the finger. In some embodiments, this type of stop may be visually represented in different ways. For example, in one embodiment, the virtual dial 354 can be programmed to either completely stop moving, or to slightly jiggle as the finger continues to rotate past the limit. In one embodiment, the latter may be accomplished by moving the virtual dial 354 by an angular amount that may oscillate as a function of excess finger rotation. For example, in one embodiment, the amount of "jiggle" could be computed as Δ=θ modulo 5 such that it repeatedly increases from 0° to 5° before dropping again to 0° as the finger continues to turn.

In some embodiments, the virtual dial 354 may produce distinct feedback as the limit of the range of motion is reached. In some embodiments, this haptic effect may be associated with a 50-Hz periodic temporal signal that is either square or sinusoidal. In other embodiments, other temporal or spatial textures may be output at the end of the range of motion. For example, in some embodiments, the end of the range of motion may be associated with a dense array of detents or a more complex temporal pattern. In some embodiments, this effect may be tuned to simulate the feeling of the user's finger brushing against the visual tick marks of the virtual dial 354. In another embodiment, this type of effect may be tuned to simulate the feeling that the virtual dial 354 is clicking as it reaches its limit.

In some embodiments, other haptic effects may be associated with the movement of a virtual dial 354. For example, in one embodiment, the haptic effect may be associated with a non-linear mapping so that virtual dial 354 appears to resist rotation as if spring-loaded. In some embodiments, the virtual dial 354 can optionally snap to discrete tick locations when released. In some embodiments, the mapping from angular motion to dial displacement may be non-linear such that the virtual dial 354 visually appears to release motion. In some embodiments, these types of effects may reinforce the illusion of a physical effect in the dial's internal mechanism.

In some embodiments, the user may feel haptic effects while interacting with virtual dial 354. For example, while virtual dial 354 is within its travel range, the computing device 351 may be configured to output detent effects in the form of brief pulses of electrostatic feedback. In one embodiment, these pulses may be produced as a function of the angular displacement, resulting in spatial ESF patterns. For example, in one embodiment, a pulse extending over 7.2° can be produced as the virtual dial 354 rotates over a tick. More precisely, a waveform producing such a spatial mapping can be produced at each sampling interval based on the current and previous angular displacement. In some embodiments, this type of signal may result in a slight rendering delay.

Further, in some embodiments, the computing device 351 may produce haptic effects configured to simulate distinct detents as the virtual dial 354 is rotated. For example, in one embodiment, the computing device 351 may produce haptic effects configured to simulate 10 detents per turn of the virtual dial 354. In some embodiments, the number of detents may be tuned to match the visual representation of the virtual dial 354. For example, this number can be equal to the number of visual tick marks or a fraction thereof, so as to establish a clear physical model.

In other embodiments, different areas within the virtual dial's range of motion, which may be continuous, may be associated with different effects. For example, in one embodiment, square pulses of ESF may be associated with one area in the virtual dial 354's range of motion. Similarly, in such an embodiment, sinusoidal pulses may be associated with another area in the virtual dial 354's range of motion. In some embodiments, the square pulses may feel sharper to the user than the sinusoidal pulses. Thus, for example, in one embodiment, the virtual dial 354 may be associated with a temperature control. In such an embodiment, warm temperatures may be associated with the square pulses, and sinusoidal pulses may be associated with cold temperatures. In other embodiments, other pulse types may be used to output haptic effects, e.g., pulses of varying intensity, width, shape, etc.

In other embodiments, computing device 351 may be configured to output different types of haptic effects associated with virtual dial 354. For example, in one embodiment, the haptic effect may be output by gradually increasing the ESF output as the virtual dial 354 moves from one tick mark to the next in the rotation. Further in such an embodiment, the output may be abruptly decreased when the tick is reached. Such an embodiment may simulate an abrupt change at each tick. Further, in some embodiments, the magnitude of tactile effects such as a temporal texture (periodic signal) or series of pulses can also be modulated based on the virtual dial 354's position. For example, in an embodiment wherein the virtual dial 354 is configured to control a temperature function the computing device 351 may be configured to increase the modulation or intensity of the pulses as temperature increases or decreases from the neutral point.

Figure 4A:
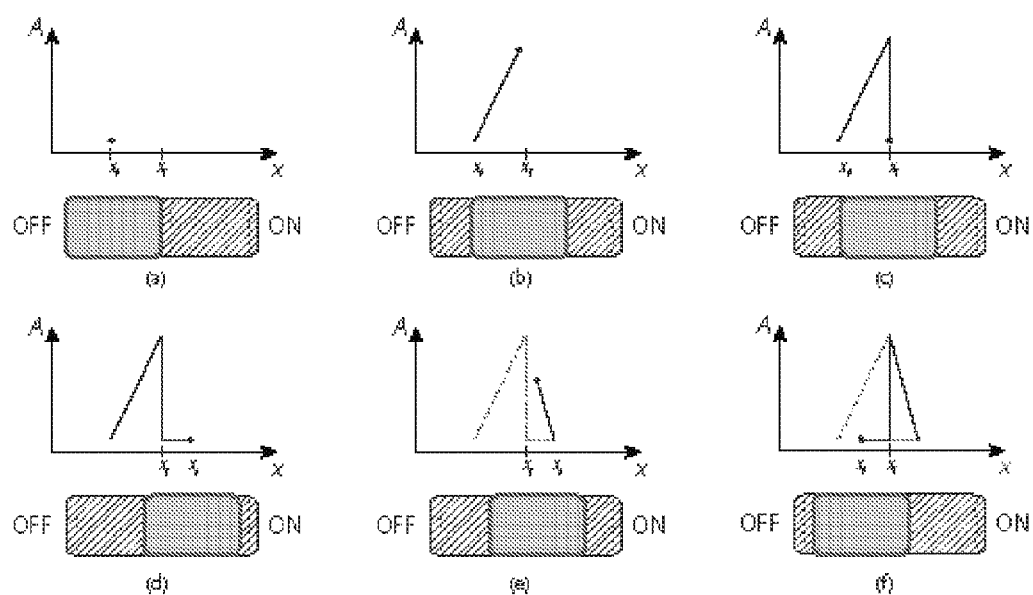
FIG. 4A depicts an illustrative system for simulated physical interactions with haptic effects.

Turning now to FIG. 4A, which illustrates one embodiment of the use of haptic feedback for a sliding toggle switch that alternates between ON and OFF states, with a transition effect occurring at 50% of the switch's travel. In some embodiments, this algorithm can also be applied to transition effects as a carrousel of images is scrolled through horizontally, indicating the switch from one picture to the next (described in further detail below with regard to FIG. 5). Further, in some embodiments, this algorithm can also be applied to page swapping in an e-book reader, or the swapping of home pages in a smartphone operating system.

As shown in FIG. 4A, the amplitude of a periodic driving signal is modulated based on the current position of the toggle switch and past history of the toggle switch. As shown at (a) the toggle begins in the OFF state and the haptic output is set to the minimal amplitude. Next as shown at (b), the toggle slides towards the right and the amplitude of the haptic output increases linearly. Then at (c), the toggle reaches its threshold $x_T$ as the amplitude of the haptic output reaches its maximum. Next at (d), the haptic output then drops abruptly to the minimum. Then at (e), the haptic output remains at the minimum as the toggle switch continues sliding toward the right. In some embodiments, if the toggle switch is slid back toward the left before it reaches its maximum travel, the haptic output begins increasing linearly again using the maximum x value reached as a reference. Then at (f), the amplitude decreases again following the same amplitude-position curve if the toggle is moved toward the right again. If the toggle moves below the threshold $x_T$, the toggle switches back to the OFF state and the haptic output drops back to the minimum. In some embodiments, a similar process may be repeated if the toggle changes direction.

Figure 4B:
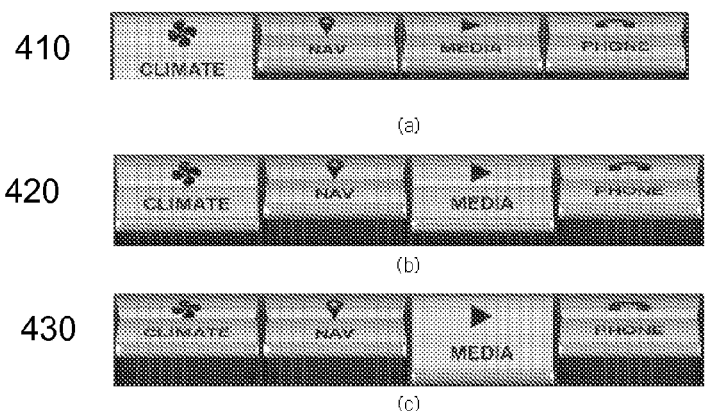
FIG. 4B depicts an illustrative system for simulated physical interactions with haptic effects.

Turning now to FIG. 4B, FIG. 4B shows three sets of virtual header tabs, 410, 420, and 430. In some embodiments, virtual header tabs 410, 420, and 430 may comprise navigation widgets that replace navigation headers so as to enable the use sliding gestures. Further, in some embodiments, the virtual header tabs shown in FIG. 4B may control the display of the different functional panels of a user interface. In the embodiment shown in FIG. 4B, the virtual header tabs are represented as if folded, with a gripping bar at the bottom. In some embodiments, virtual header tabs of this type may be activated by user interaction anywhere on the header. For example, in one embodiment, the virtual header tabs may be activated by a user interaction sliding horizontally to the intended tab, and sliding down to unfold and activate the tab. In some embodiments, the currently active virtual header tab may fold gradually as the newly selected virtual header tab unfolds. This is demonstrated as the climate tab unfolds slowly from its position in 410, through the position in 420, to the position in 430, while at the same time, the media tab folds slowly from its position in 410, through the position in 420, to the position in 430. In other embodiments, a tab may snap to the opposite position when released.

Further, in some embodiments, when the user interacts with one or more of the virtual header tabs shown in FIG. 4B, a computing device may output a haptic effect. In one embodiment, this haptic effect may comprise a temporal texture. In one embodiment this effect may be output by transmitting a haptic signal comprising a 200-Hz square wave with 50% intensity for inactive tabs, and a 50-Hz square wave at 100% intensity for the active tab. In some embodiments, this type of haptic signal may be output to a haptic output device configured to simulate a texture or variation in the perceived coefficient of friction. In some embodiments, this simulated texture may be interrupted as the user's finger passes between tabs, and thus simulate a transition effect. Further, in some embodiments, the haptic effect may be produced by linearly reducing the intensity of the texture and increasing it again over a distance of 100 pixels. In some embodiments, interacting with a tab may trigger a linear transition of the amplitude and frequency, transforming an inactive texture into an active texture. Further, in some embodiments, the haptic output may be terminated abruptly once the tab has been completely extended, triggering an edge effect.

In some embodiments, the widgets described above with regard to FIGS. 3A-4B may be implemented in such a way that they can be discovered while sliding against the screen, without activating them. In some embodiments, the user may be able to enter an exploration mode when touching down on the screen at a location where there is no widget. In such an embodiment, the widgets may then become unresponsive, but the computing device 301 may produce a haptic effect that indicates the position of the widgets. Further, in some embodiments, this haptic effect may be associated with the state of each of these widgets. For example, in some embodiments, a pulse may be emitted when the user's finger enters or leaves the bounding area of a widget. In one embodiment, this haptic effect may comprise a 50-ms square signal. Further, in some embodiments, this signal could be output when the user's finger is near the boundary of a widget. In such an embodiment, the boundary of a widget may be simplified for computational efficiency (e.g., placing the widget in a bounding box or circle).

Similarly, in some embodiments, the computing device 301 may also output a texture or effect configured to vary the perceived coefficient of friction when the user's finger is sliding inside of the widget. In some embodiments, this effect may comprise a temporal texture, which may be associated with a haptic signal comprising a 100-Hz sinusoid as the user's finger is sliding over the widget. Furthermore, in some embodiments, this haptic effect may vary depending on the state of the widget: e.g., whether it is ON or OFF, whether it is sensitive or insensitive, etc.

Figure 5:
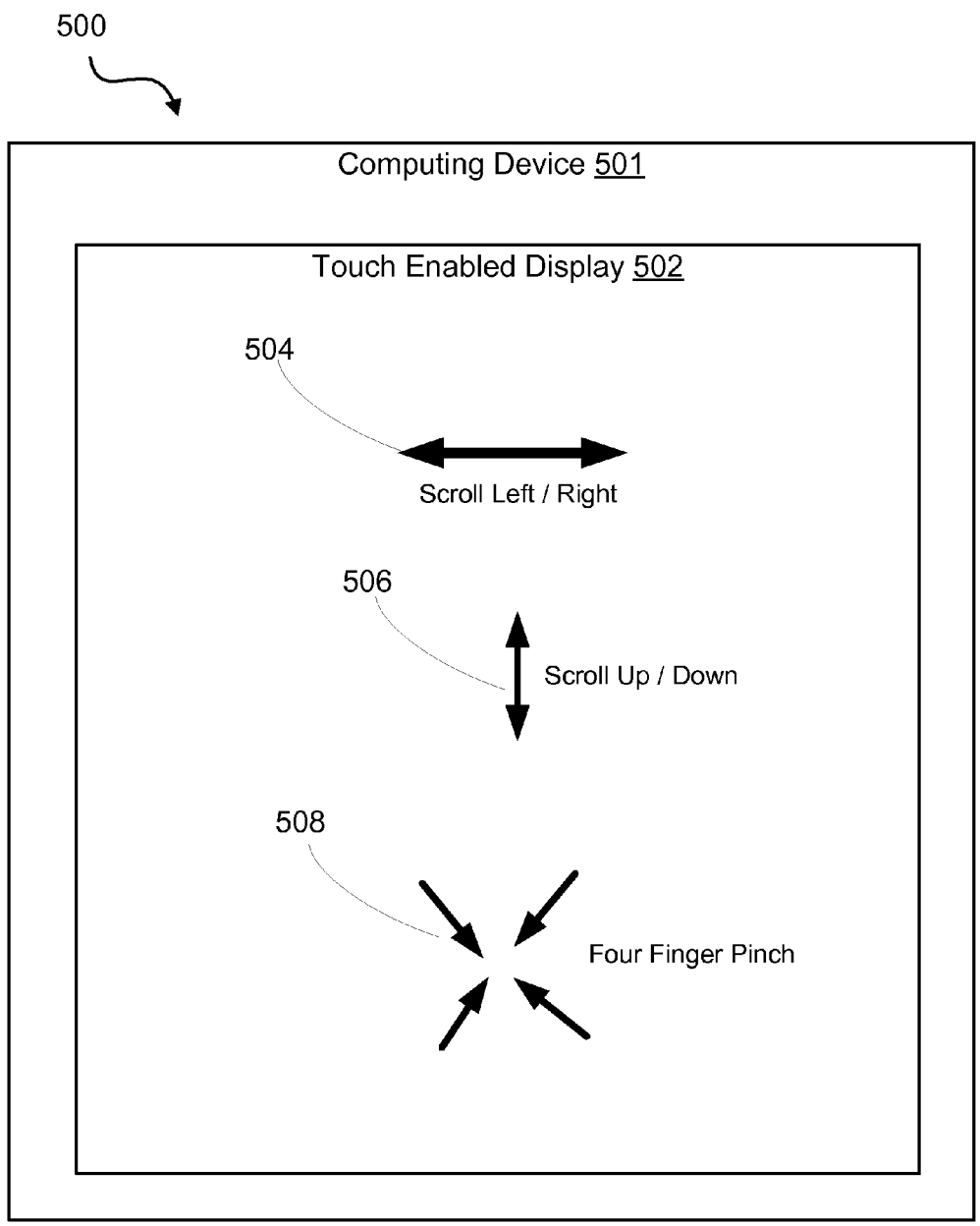
FIG. 5 is an illustration of a system for simulated physical interactions with haptic effects.

Turning now to FIG. 5, FIG. 5 illustrates an example embodiment of mode or state awareness with programmable surface texture. FIG. 5 is a diagram illustrating an external view of a system 500 comprising a computing device 501 that comprises a touch enabled display 502. In some embodiments, computing device 501 may comprise a handheld device, such as a smartphone, tablet, pocket organizer, GPS receiver, or other handheld device known in the art.

FIG. 5 further depicts three different gestural interactions 504, 506, and 508. Each of gestural interactions 504, 506, and 508 comprises a user interaction with touch enabled display 502. For example scroll left/right 504 comprises an interaction wherein the user, swipes his or her finger to the left or the right across the surface of touch enabled display 502. As known in the art, such a gesture may cause the screen shown on touch enabled display 502 to scroll to the left or the right. Similarly, scroll up/down 506 comprises a gesture wherein the user swipes his or her finger up or down across the surface of touch enabled display 502. Such a gesture may cause computing device 501 to change the screen shown on touch enabled display 502 to scroll up or down. Finally, four finger pinch 508 may occur when using four or five fingers, the user makes a pinching gesture on the surface of touch enabled display 502. Such a gesture may cause computing device 501 to display a "home" screen on touch enabled display 502. In other embodiments, other gestures detected by touch enabled surface 502 may control computing device 501. For example, some known gestures may be gestures to zoom, gestures to change programs, or gestures to go back.

Further, in the embodiment shown in FIG. 5, computing device 501 may output a haptic effect to confirm receipt of a gesture. For example when a user makes a gesture to scroll left/right, computing device 501 may output a haptic effect to confirm receipt of this gesture. In some embodiments, this haptic effect may comprise a haptic effect configured to simulate a texture on the surface of touch enabled display 502. In other embodiments, this haptic effect may comprise a haptic effect configured to change the coefficient of friction the user feels when moving his or her finger over the surface of touch enabled display 502. For example, in one embodiment, the haptic effect may be associated with a haptic signal comprising a 200-Hz sinusoid. Further, in such an embodiment, the magnitude of the haptic signal may be varied at or near the point where the screen changes to a new page. In some embodiments the user may scroll through, for example, a photo album. In such an embodiment, as the user scrolls through each picture the computing device 501 may output a simulated texture of increasing intensity as the user swipes each picture to the left or right. Further, the computing device 501 may output a sharp detent as the next picture swaps into the previous picture's place on touch enabled display 502.

Similarly, in some embodiments, additional haptic effects may be output to confirm receipt of gestures such as scroll up/down 506 or four finger pinch 508. In some embodiments, these haptic effects may comprise different haptic effects. In such an embodiment, the haptic effect may allow the user to know the device has received the gesture. Thus, the user may be able to quickly move on to another gesture, and therefore be able control computing device 501 more quickly. For example, as the user engages in one gesture to scroll to a new page, a haptic confirmation may allow the user to quickly determine that the interaction has been received, and move on to a new gesture, for example, a gesture associated with opening a program. Further, a haptic effect may provide a confirmation that the program is open, allowing the user to quickly move on to a gesture associated with an operation in that program.

In some embodiments, the gestures described above with regard to FIG. 5, may be used to simulate a carrousel on a display. For example, in one embodiment, an album display allows the selection of an album cover through a sequence of transitions. In some embodiments, this principle can more generally be applied to carrousels of content such as images.

In some embodiments, the album display is an interactive widget that visually scrolls through a set of album covers with horizontal swiping gestures. In some embodiments, the user interacts with or "captures" the object by placing a finger on its surface horizontally dragging album covers. In some embodiments, the size and shading of album covers is modified as they slide into focus, and albums snap into the nearest position on release.

In some embodiments, computing device 501 may produce a gradual transition effect as albums are swapped, as well as a grating texture when a limit has been reached. In some embodiments, the transition effect may be produced by linearly increasing the intensity of a 200-Hz square wave output to a haptic output device configured to simulate a texture until a transition occurs, at which point the intensity suddenly drops. In such an embodiment, the intensity may increase again if reversing course or sliding the next album into focus. In some embodiments, a limit effect may be produced by outputting an effect comprising a velocity-based grating texture with a pitch of 50 pixels. For example, in some embodiments this effect may be produced by periodically increasing or decreasing the frequency of a square wave output to a haptic output device based on the velocity of an object (e.g., a finger or a stylus) on the surface of a touch screen. In some embodiments, the measurement of velocity may be based in part on the number of pixels over which the user's finger passes in a given length of time.

In some embodiments, this type of interaction could be augmented with other types of haptic effects. For example, in one embodiment, simple pulses could for example be felt when switching from one album cover to the next. Furthermore, in some embodiments, the haptic feedback may be tuned to match the physical model of a mechanism allowing the albums to be moved. For example, in one embodiment, the album carousel may comprise haptic effects configured to simulate the feeling that the carousel is operated by gears. In some embodiments, this may be simulated by outputting detents as the content in the carousel scrolls.

Figure 6:
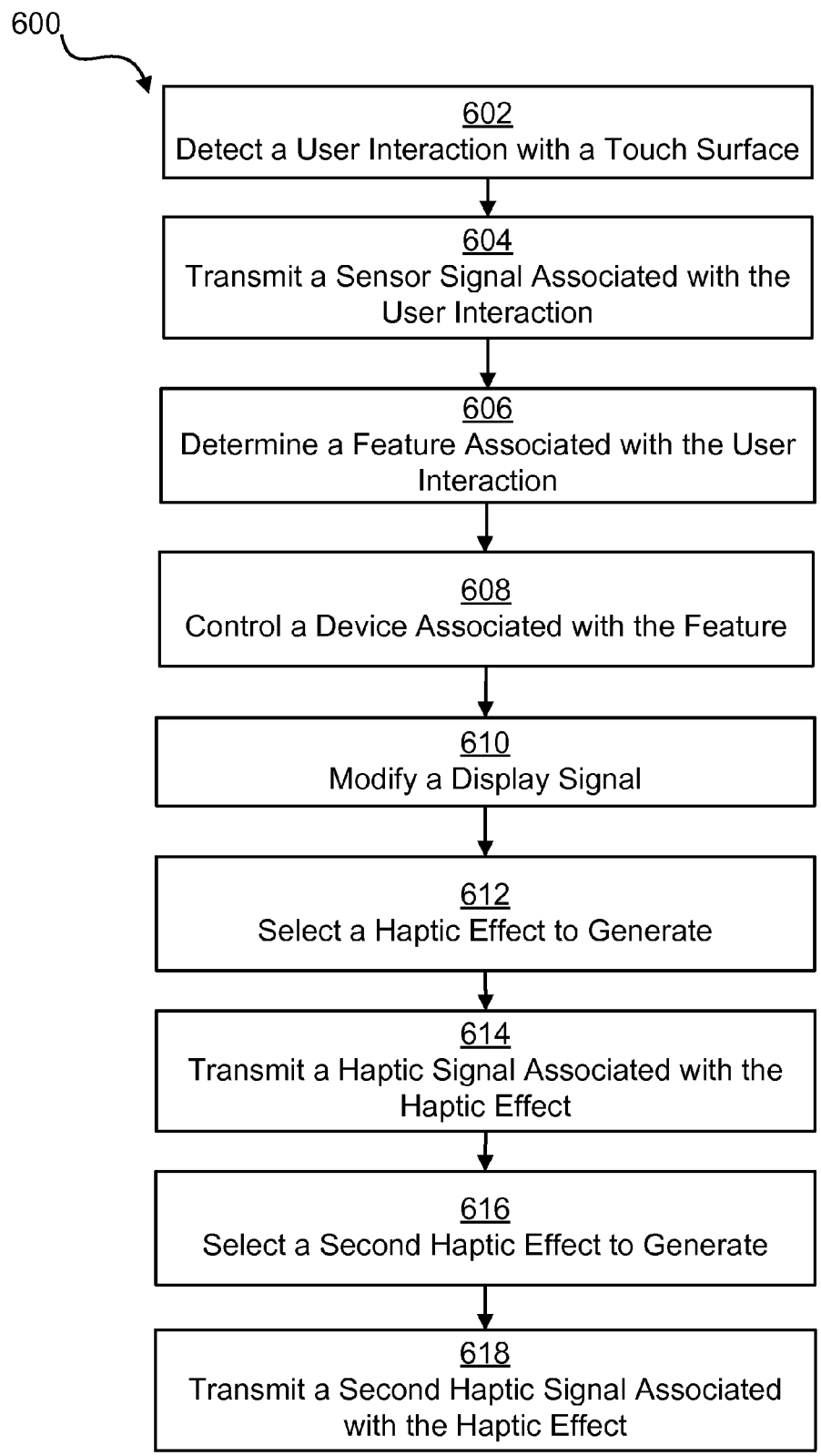
FIG. 6 is flow chart of steps for performing a method for simulated physical interactions with haptic effects.

Illustrative Methods for Providing Simulated Physical Interactions with Haptic Effects FIG. 6 is a flowchart showing an illustrative method 600 for providing simulated physical interactions with haptic effects. In some embodiments, the steps in FIG. 6 may be implemented in program code that is executed by a processor, for example, the processor in a general purpose computer, a mobile device, or a server. In some embodiments, these steps may be implemented by a group of processors. The steps below are described with reference to components described above with regard to system 100 shown in FIG. 1.

The method 600 begins at step 602 when sensor 108 detects a user interaction with touch surface 116. Sensor 108 may comprise one or more of a plurality of sensors known in the art, for example, resistive and/or capacitive sensors may be embedded in touch surface 116 and used to determine the location of a touch and other information, such as pressure. As another example, optical sensors with a view of the touch surface may be used to determine the touch position. In still other embodiments, sensors 108 and touch surface 116 may comprise a touch screen display. Further, upon detecting a first interaction, sensors 108 may send a signal associated with that interaction to processor 102.

The method 600 continues when processor 102 transmits a sensor signal associated with the user interaction. In some embodiments, the sensor signal may comprise the location of the user interaction. For example a location on the surface of a touch surface 116. Furthermore, in some embodiments, this location may be associated with a virtual interface or "widget" of the type described above. Similarly, in some embodiments, the sensor signal may comprise data associated with the speed or force of the user interaction. For example, the sensor signal may indicate how fast the user's finger is moving, or whether the user is pressing with force onto touch surface 116.

The method continues when processor 102 determines a feature associated with the user interaction 606. In some embodiments, the processor 102 may determine the position of the user interaction based in part on the sensor signal. Further, in some embodiments, the processor may determine that the user interaction is associated with a feature, which may, for example, comprise a widget of the type described in the preceding paragraphs. For example, the processor 102 may determine that the user interaction is over top of the widget. In some embodiments, the widget may comprise a button, switch, knob, virtual desktop, or other type of virtual interface described herein. Further, the processor 102 may determine based on the location of the user interaction that the user is interacting with the widget. For example, the processor 102 may determine that the user interaction is within the bounds of the widget on a display, or within certain proximity of the bounds of the widget, and based on this determination, determine that the user is interacting with the widget.

The method continues when processor 102 controls a device associated with the feature 608. In some embodiments, this device may comprise one or more of a computing device, a mobile device, an application on a device, a function on an automobile, a function on a bus, a function on an airplane, or some other function that may be controlled by a traditional interface, such as a button, switch, knob, dial, slider, etc. As the user interacts with the widget, the processor 102 may modify the operation of the system controlled by the widget. For example, in one embodiment, as the user turns a knob associated with a fan, the processor 102 may send a signal configured to modify the speed of the fan. Similarly, in another embodiment, as the user interacts with a widget associated with a music player application, the processor 102 may modify the volume output by the music player, or some other function associated with the music player (e.g., track selection, location in track, or audio output settings).

The method continues when processor 102 modifies a display signal 610. The display signal may be output to an I/O component 112 and be displayed to the user. For example, in some embodiments, I/O components 112 may comprise a display or touch screen display. In such an embodiment, the display may show an image associated with the mode. For example, in one embodiment, the display may comprise an image associated with one of the systems shown in FIGS. 3A-5. Processor 102 may modify one or more features of the display signal. For example, in one embodiment the user may interact with a widget such as a virtual switch or a virtual knob. In such an embodiment, the processor 102 may change a display signal at a location associated with the virtual switch or the virtual knob based in part on the user interaction. This display signal may then be output to I/O component 112, which displays the modified virtual switch or virtual knob to the user.

The method continues when processor 102 selects a haptic effect to generate 612. The processor may rely on programming contained in haptic effect determination module 126 to select or determine the haptic effect. For example, the processor 102 may access drive signals stored in memory 104 and associated with particular haptic effects. As another example, a signal may be generated by accessing a stored algorithm and inputting parameters associated with an effect. For example, an algorithm may output data for use in generating a drive signal based on amplitude and frequency parameters. As another example, a haptic signal may comprise data sent to an actuator to be decoded by the actuator. For instance, the actuator may itself respond to commands specifying parameters such as amplitude and frequency. In some embodiments, the haptic effect may be one of a plurality of available textures. For example, the plurality of textures may comprise one or more of the textures of: water, grass, ice, metal, sand, gravel, brick, fur, leather, skin, fabric, rubber, leaves, or any other available texture, for example, a texture associated with explosions or fire. In some embodiments, the texture may be associated with a feature of a user interface, such as a widget displayed to the user. For example, in one embodiment, a specific texture may be associated with virtual dial, for example, the texture of sand. Further, in such an embodiment, as the user interacts with the virtual dial, for example, by modifying the angular rotation of the virtual dial, the processor 102 may output a different texture. For example, as the user turns the virtual dial, the haptic effect may be configured to simulate a change in the coarseness of the sand. Thus, as the user turns the virtual dial in one direction, the user may feel a haptic effect that simulates gravel, and as the user turns the virtual dial the other direction the user may feel a haptic effect that simulates the feeling of a powder.

The method continues, at step 614 when processor 102 transmits a haptic signal associated with the haptic effect to haptic output device 118, which outputs the haptic effect. In some embodiments, processor 102 outputs a haptic signal configured to cause haptic output device 118 to generate the haptic effect. In some embodiments haptic output device 118 may comprise traditional actuators such as piezoelectric actuators or electric motors coupled to touch surface 116 or other components within computing device 101. In other embodiments haptic output device 118 may comprise one or more electrostatic actuators configured to simulate textures or vary the perceived coefficient of friction on touch surface 116 using electrostatic fields.

Next, processor 102 determines a second haptic effect 618. In some embodiments the second haptic effect may comprise a confirmation that the operation discussed with regard to step 608 has been completed. In other embodiments, the haptic effect may comprise a warning that the operation discussed above with regard to step 608 was not completed. The processor may rely on programming contained in haptic effect determination module 126 to determine the second haptic effect. For example, the processor 102 may access drive signals stored in memory 104 and associated with particular haptic effects. As another example, a signal may be generated by accessing a stored algorithm and inputting parameters associated with an effect. For example, an algorithm may output data for use in generating a drive signal based on amplitude and frequency parameters. As another example, a haptic signal may comprise data sent to an actuator to be decoded by the actuator. For instance, the actuator may itself respond to commands specifying parameters such as amplitude and frequency. In some embodiments, the haptic effect may be one of a plurality of available textures. For example, the plurality of textures may comprise one or more of the textures of: water, grass, ice, metal, sand, gravel, brick, fur, leather, skin, fabric, rubber, leaves, or any other available texture. In some embodiments, the texture may be associated with the widget or features within the widget. For example, in one embodiment, a specific texture may be associated with a widget when it is configured to control a music player, e.g., the texture of sand. Further, in such an embodiment, different types of music may each comprise separate textures that may be output to the widget. For example, when a blue grass song is played, the texture may comprise a texture associated with grass and when heavy metal is played, the texture may comprise the texture of metal.

The method 600 continues, when processor 102 transmits a second haptic signal associated with the second haptic effect to haptic output device 118, which outputs the second haptic effect 618. In some embodiments, processor 102 outputs a haptic signal configured to cause haptic output device 118 to generate the haptic effect. In some embodiments haptic output device 118 may comprise traditional actuators such as piezoelectric actuators or electric motors coupled to touch surface 116 or other components within computing device 101. In other embodiments haptic output device 118 may comprise one or more electrostatic actuators configured to simulate textures using electrostatic fields.

Additional Embodiments of Systems for Simulated Physical Interactions with Haptic Effects In some embodiments of the present disclosure, physical interactions may be used on a device without any particular purpose other than to entertain, distract, or calm down a user. For example, in one embodiment, wallpaper, for example a "Live Wallpaper" may react to a user's touch. In some embodiments of the present disclosure, physical interactions can be augmented with matching haptic effects, for example, electrostatic friction effects. In some embodiments, these haptic effects can entirely replace other effects to generate a tactile-only experience. Further, in some embodiments, similar interactions can be used in touchscreen applications. For example, in one embodiment a touchscreen application may be comprise effects that keep users occupied or distracted.

Figure 7:
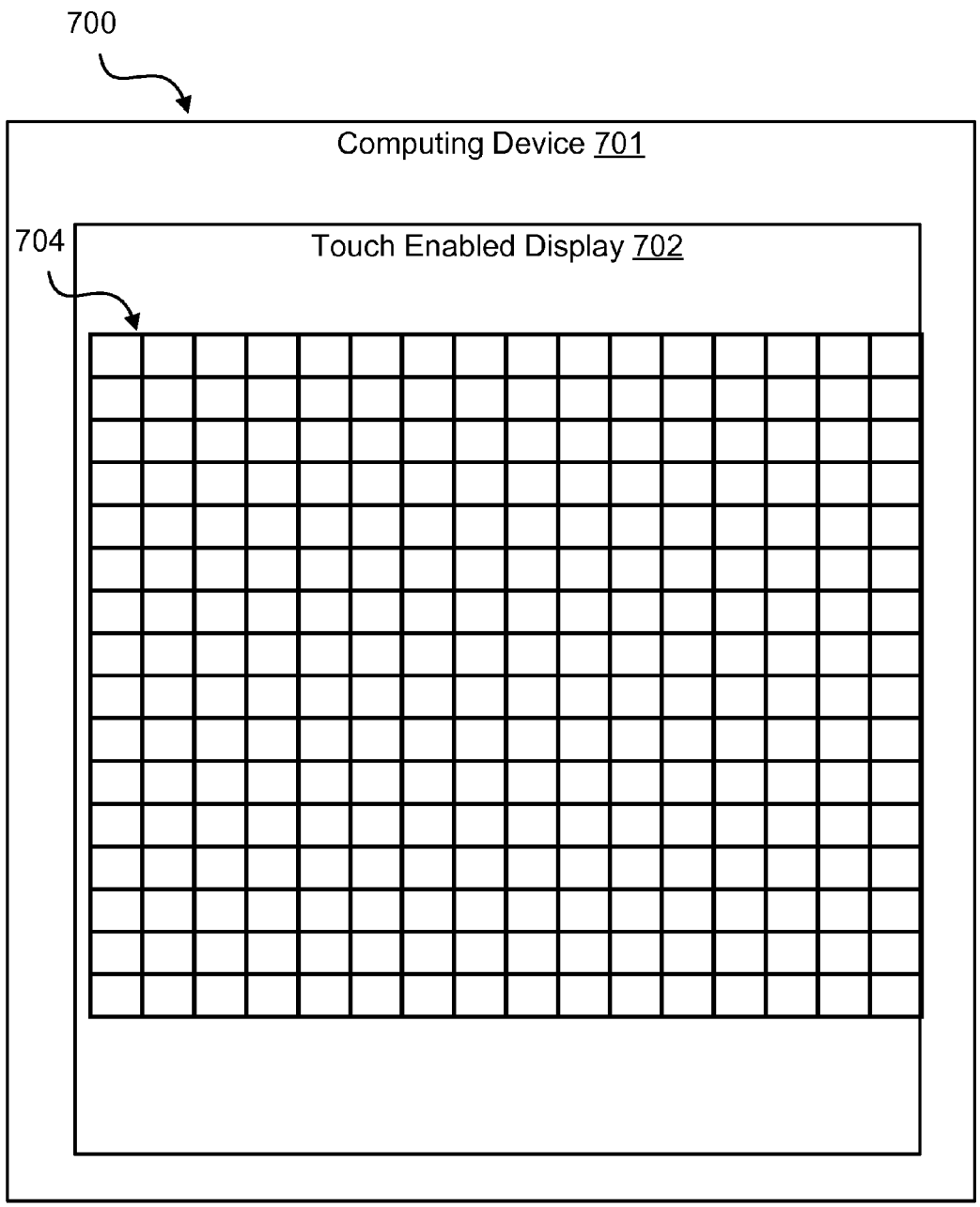
FIG. 7 is an illustration of a system for simulated physical interactions with haptic effects.

Turning now to FIG. 7, which illustrates one embodiment of simulated physical interactions with haptic effects. The embodiment shown in FIG. 7 comprises an array of tiles 704 on a touch enabled display 702 of computing device 701. In some embodiments, as the user moves his or her finger across the surface of touch enabled display 702, the user may interact with one or more of the tiles. As the user interacts with the tiles 704, the tiles 704 may be disturbed by the motion of a finger, getting pushed into the screen or tilting. In some embodiments, the computing device 701 may output a haptic effect associated with this interaction. For example, in one embodiment, computing device 701 may output an electrostatic effect configured to simulate a texture or vary the perceived coefficient of friction on the surface of the touch enabled display as the user's finger interacts with one or more of the tiles. For example, in such an embodiment, the simulated texture could drop when a tile is pushed in, or another brief effect could be output as the user's finger brushes across each tile. In another embodiment, a dynamic effect may be output as a tile tilts, haptically communicating the instability of the tile to the user.

Figure 8:
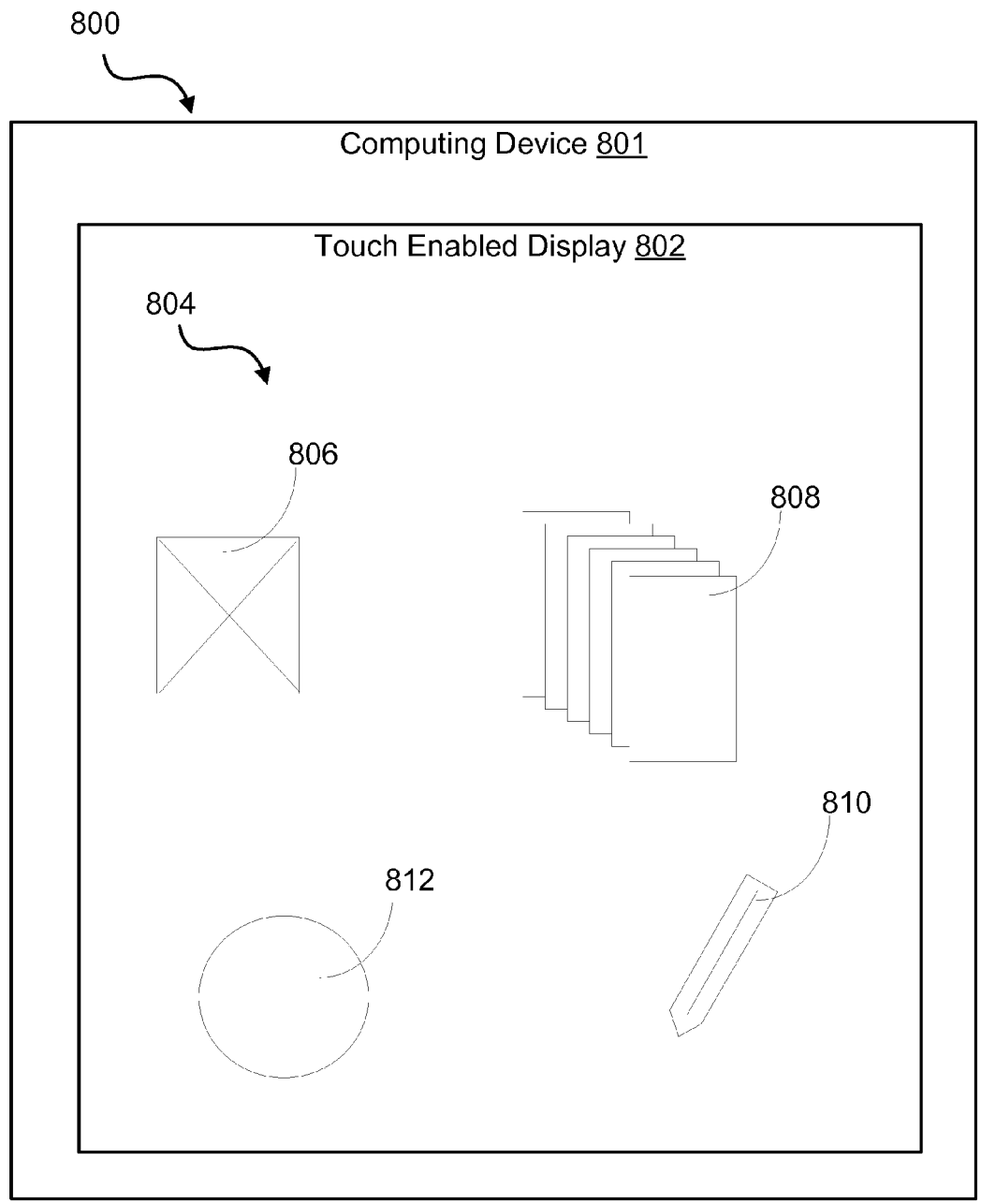
FIG. 8 is another illustration of a system for simulated physical interactions with haptic effects.

Turning now to FIG. 8, which illustrates one embodiment of simulated physical interactions with haptic effects. In some embodiments of the present disclosure, simulated physical interactions with haptic effects may be used to extend the popular desktop metaphor with simulated three-dimensional effects and physical interactions. The embodiment shown in FIG. 8 comprises an image of a virtual desktop 804 on a touch enabled display 802 of computing device 801. In some embodiments, as the user interacts with various features of the virtual desktop 804, such as icon 806, documents 808, pencil 810, or ball 812, the user may feel a corresponding haptic effect on the surface of touch enabled display 802.

For example, in one embodiment of the present disclosure, the virtual desktop 804 may comprise documents 808, which may be associated with one or more documents (e.g., emails, text files, spreadsheets, presentations, etc.). In such an embodiment, the documents 808 may be positioned in a pile that can be toppled by a finger on touch enabled display 802 swiping horizontally against the pile. In some embodiments, this interaction could be augmented with haptic feedback, such as electrostatic feedback, that matches the physical effect. For example, in such an embodiment, an impact could be felt through a brief increase in electrostatic output as the finger impacts the documents 808. Similarly, in some embodiments, brushing textures and detents could then be output to simulate the feeling of items in the documents 808 sliding against one another and falling over. In some embodiments, similar or additional effects could also be produced by vibration-based feedback.

In another embodiment of the present disclosure, a user may throw a document 808 across the screen of touch enabled display 802 by making a flicking gesture against it. In some embodiments, the impact with the document may be simulated by an increase in electrostatic output. In some embodiments, these effects or other effects could also be produced by vibration-based feedback.

In another embodiment of the present disclosure, a user may group documents into a pile by bringing them together with a 5-finger gesture. In such an embodiment, computing device 801 may output electrostatic haptic effects to simulate the impact and brushing of documents as they bump and slide against one another into a pile. In some embodiments, these effects or other effects could also be produced by vibration-based feedback.

In another embodiment of the present disclosure, a user may translate multiple documents 808 by pressing the long side of his or her finger against the touch enabled display 802 and pushing against the documents 808. In such an embodiment, electrostatic feedback could be used to simulate impacts with the different documents. Similarly, electrostatic feedback could be used to simulate the documents 808 brushing against the surface of the virtual desktop 804. In still other embodiments, the computing device 802 may modulate the intensity of the effect based on the number and type of documents. In some embodiments, these effects or other effects could also be produced by vibration-based feedback.

Further, in some embodiments, similar haptic effects could be output when the user interacts with icon 806, pencil 810, or ball 812. For example, computing device 801 may be configured to output a haptic effect associated with a variance in the perceived coefficient of friction as the user draws or writes using pencil 810. Similarly, computing device 801 may be configured to output haptic effects simulating impacts as the user pushes ball 812 across touch enabled display 802. In some embodiments, ball 812 may impact other objects within the virtual desktop 804, and computing device 801 may be configured to output haptic effects associated with these impacts.

In other embodiments, simulated physical interactions with haptic effects could be incorporated into other applications. For example, in some embodiments, simulated physical interactions with haptic effects could be incorporated into electronic books, e.g., into text or graphics in electronic books.

Figure 9:
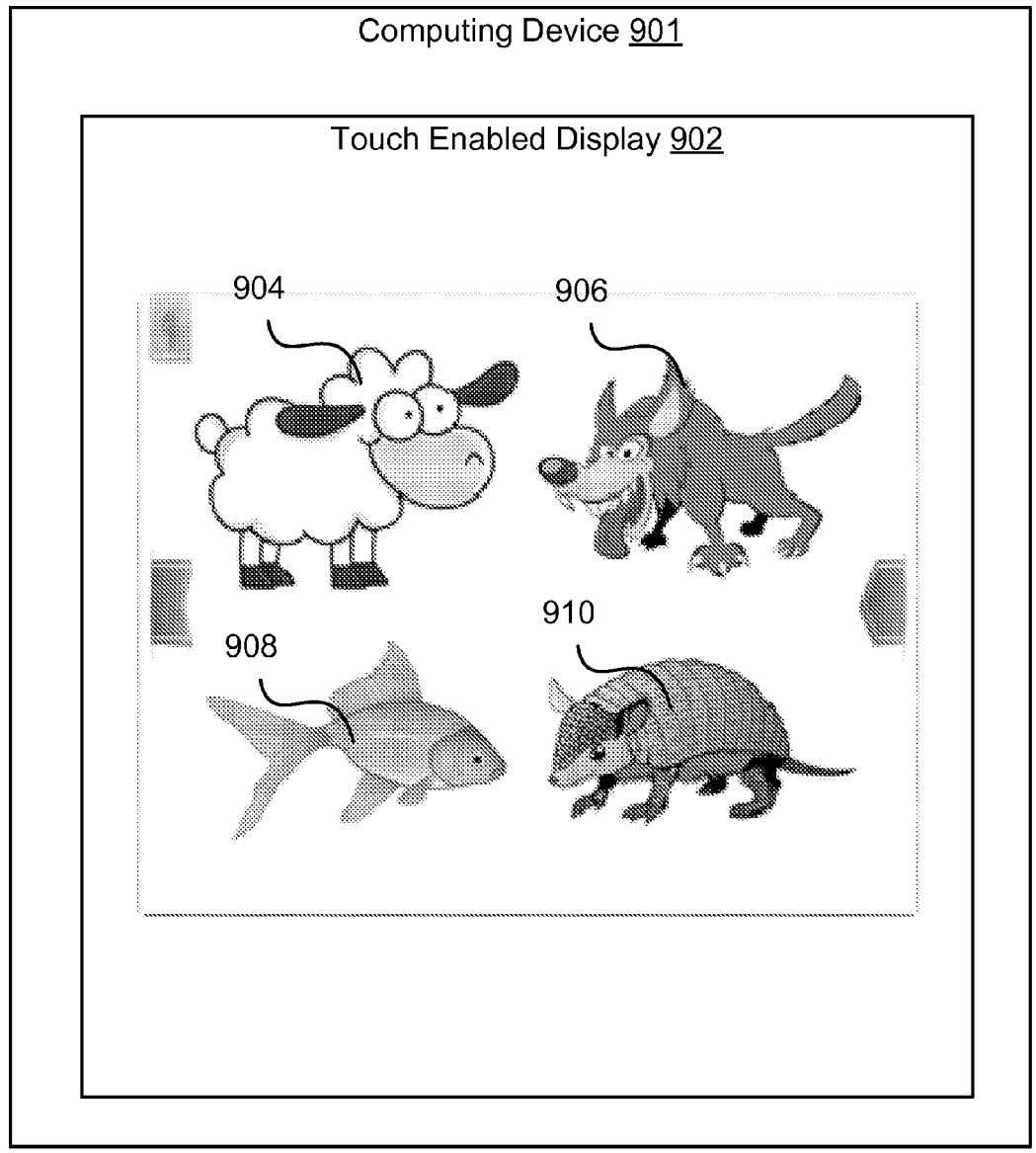
FIG. 9 is yet another illustration of a system for simulated physical interactions with haptic effects.

Turning now to FIG., 9, which comprises a computing device 901 comprising a touch enabled display 902. As shown in FIG. 9, the touch enabled display 902 comprises four graphics, which in the embodiment shown in FIG. 9 are four animals, a sheep 904, a wolf 906, a fish 908, and an armadillo 910. Further, in some embodiments, as the user moves his or her finger across the surface of the touch enabled display 902, the computing device 901 may be configured to output a haptic effect associated with each of the animals. In some embodiments, this haptic effect may comprise a haptic effect configured to vary (e.g., increase or decrease) the perceived coefficient of friction. In other embodiments, this haptic effect may comprise a texture output to the surface of touch enabled display 902.

In some embodiments, each of the four animals may comprise a different haptic effect. Further, in some embodiments, the user may feel the haptic effect associated with each animal only when sliding his or her finger over that animal on touch enabled display 902. Further, in some embodiments, the user may feel a haptic effect only when sliding his or her finger over a part of the animal that has a non-zero value. For example, in some embodiments, the alpha channel of a graphic may comprise the transparency of that graphic. In such an embodiment, a haptic effect may be output only when the graphic has an alpha value of greater than zero. Further, in some embodiments, a bitmap may specify if and at what location within a graphic a haptic effect should be output. Similarly, in some embodiments, this bitmap may comprise data associated with the amplitude and frequency of the haptic effect. In some embodiments, this bitmap may comprise haptic data associated with the graphic. For example, in some embodiments, the amplitude and frequency of the haptic effect may be associated with one or more of the color, contrast, brightness, clarity, definition, pattern, or some other component associated with the graphic or components of the graphic. Further, in some embodiments, haptic information may be embedded into a graphic. Thus, for example, haptic effects, e.g., textures, may be output when the user interacts with locations within a graphic. In some embodiments, these haptic effects may not be associated with the appearance of the graphic. For example, in some embodiments, a grid or array of cells comprising haptic values associated with haptic effects could be included within the area of a graphic. Thus, when the user interacts with the location associated with these cells, the computing device may output a haptic effect associated with the haptic values. In some embodiments, this may give a haptic designer more control over what haptic effect may be specified in a region associated with a graphic.

In some embodiments, the body of fish 908 may comprise a texture, but the fins of fish 908 may comprise a zero value, and thus not be associated with a texture. Further, in some embodiments, each of the animals may comprise a haptic effect associated with the texture of that animal. For example, in one embodiment, when a user interacts with sheep 904 computing device 901 may output a soft haptic effect. In some embodiments, this haptic effect may be output by a haptic signal comprising a 75 Hz sinusoid wave. Further, in such an embodiment, the wolf 906 may comprise a different, and more coarse haptic effect. In some embodiments, this haptic effect may be output by a haptic signal comprising a 300 Hz square periodic wave at 50% magnitude and stochastic waveform with 200 Hz rate at 50% magnitude. Further, in some embodiments, fish 908 may comprise a haptic effect associated with scales. Thus, the user may feel a different haptic effect when moving his or her finger in different directions across the surface of fish 908. In some embodiments, this haptic effect may be output by a haptic signal comprising spatial grating (e.g., varying the frequency and or amplitude of the haptic effect based on user movement) with pitch of 25 pixels when moving to the right across the surface of the fish 908 and a 500-Hz square periodic wave at 75% amplitude when moving to the left across the surface of the fish 908. Further, in such an embodiment, armadillo 910 may comprise a haptic effect associated with its shell. In some embodiments, this haptic effect may be output by a haptic signal comprising spatial grating with a pitch of 50 pixels.

The animals and haptic effects described above with regard to FIG. 9 are examples. A person of skill in the art would recognize that any of a plurality of objects (such as animals, humans, or other types of objects) could be shown on a touch enabled display. And further that any of a plurality of haptic effects may be output when a user interacts with an area of the touch enabled display associated with each of these objects.

Figure 10A:
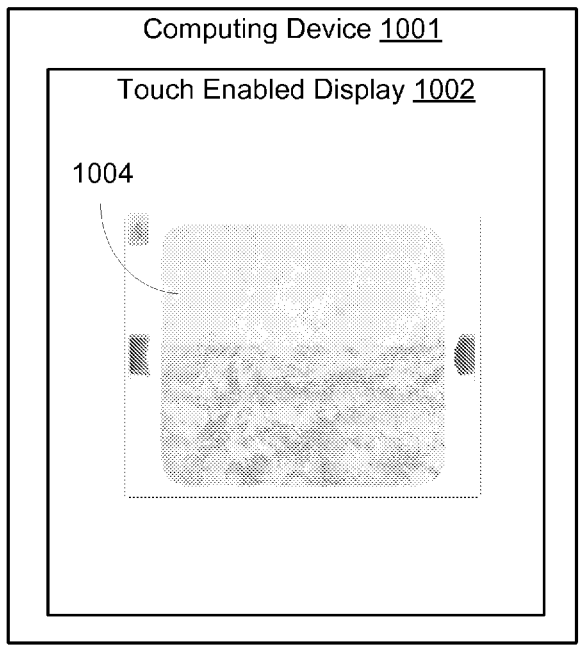
FIGS. 10A-10B are yet another illustration of a system for simulated physical interactions with haptic effects.
Figure 10B:
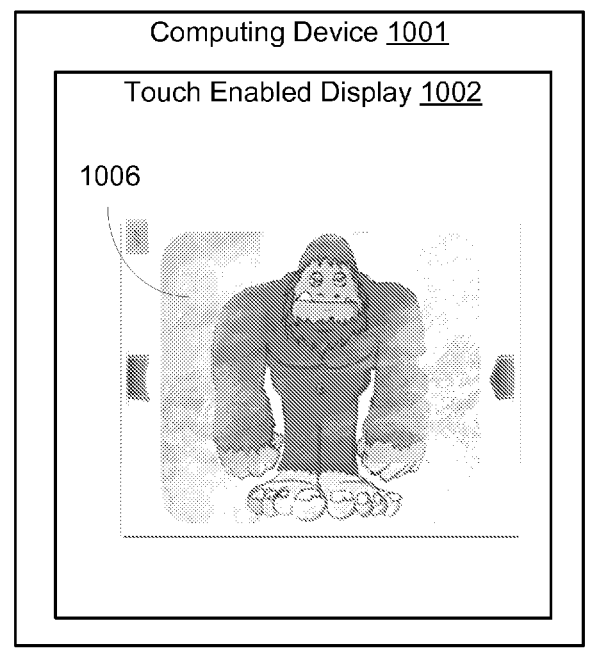

Turning now to FIGS. 10A-10B, which each comprise a computing device 1001 comprising a touch enabled display 1002. As shown in FIG. 10A, the touch enabled display further displays an area of frost 1004. As the user interacts with the area of frost 1004, the user may be able to brush away the frost 1004. In some embodiments, as the user interacts with touch enabled display 1002, an amount of frost 1004 may be gradually reduced. Further, in some embodiments, as the user increases the speed of the interaction, the rate of removal of frost may increase. For example, in one embodiment, the amount of frost removed for each user interaction (e.g., each swipe of the user's finger) varies linearly from 10% to 30% depending on the time since the last touch event. For example, in one embodiment, when the user first touches the frost 1004, a disc with a 50-pixel radius and 10% intensity may be removed from the area of frost 1004 the user touches. Further, in such an embodiment, as the user subsequently touches the frost 1004, a disc may similarly be removed at the touch location as well as a band between the current and previous position of the touch. In some embodiments, the intensity of frost 1004 removed varies from 10% to 30%. In some embodiments, this may ensure that there is no gap in the cleared path when the user moves quickly.

Turning to FIG. 10B, once the user has brushed away enough of the frost, the user may expose another object. In the embodiment shown in FIG. 10B, the user has brushed away frost to expose a monster 1006. In some embodiments, computing device 1001 may be configured to output one or more haptic effects as the user interacts with the frost 1004 and the monster 1006. In some embodiments, this haptic effect may comprise a haptic effect configured to vary (e.g., increase or decrease) the perceived coefficient of friction. In other embodiments, this haptic effect may comprise a texture output to the surface of touch enabled display 1002. In some embodiments, the haptic effect associated with the frost may be a haptic effect associated with a 200-Hz square periodic wave with a magnitude that varies linearly with the current level of frost (e.g., how much frost the user has removed). Similarly, after brushing away the frost 1004, the user may feel a haptic effect associated with monster 1006. In some embodiments, this haptic effect may be output by a haptic signal comprising a 300 Hz square periodic wave at 50% magnitude and stochastic waveform with 200 Hz rate at 50% magnitude.

Figure 11A:
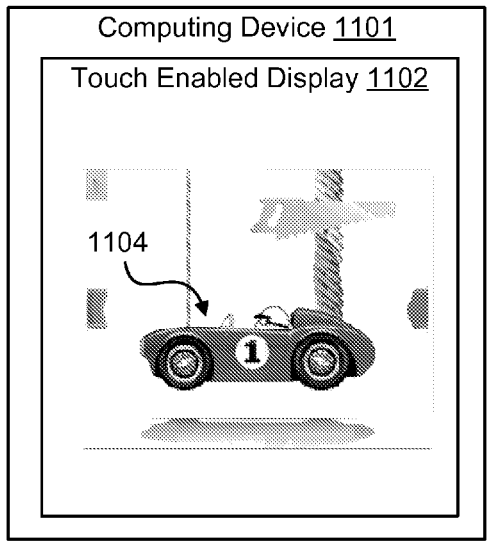
FIGS. 11A-11C are yet another illustration of a system for simulated physical interactions with haptic effects.
Figure 11C:
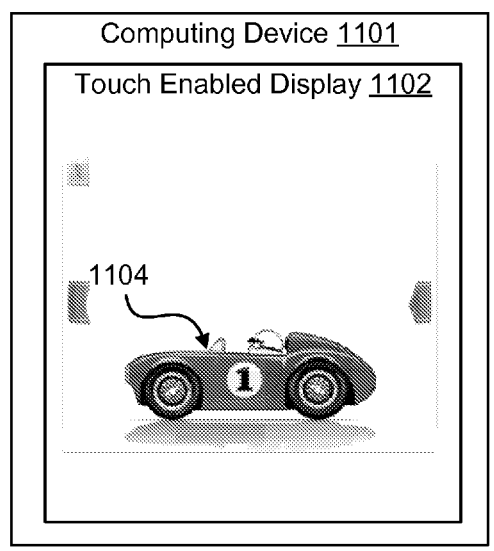
Figure 11B:
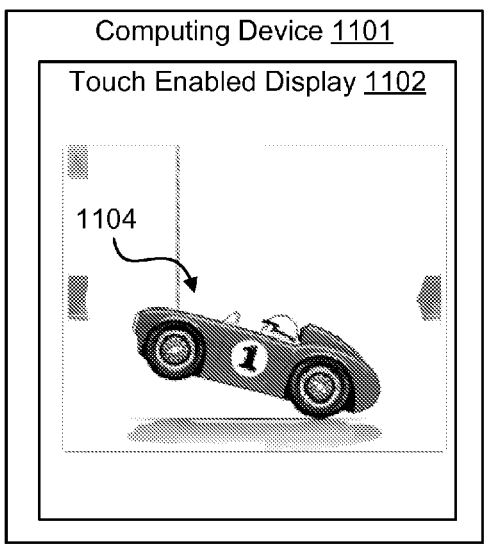

Turning now to FIGS. 11A-11C, which each comprise a computing device 1101 comprising a touch enabled display 1102. FIG. 11A further comprises a car suspended by two ropes 1104. In the embodiment shown in FIG. 11A, the rope on the left side is thin, while the rope on the right side is thick. In such an embodiment, the thin rope on the left side may be cut by a swiping gesture. In contrast, the rope on the right is thick and cutting the rope may require repeated back and forth gestures with a saw icon. In some embodiments, the saw icon may be selected by touching an area of touch enabled display 1102 associated with the saw icon.

In the embodiment shown in FIG. 11A, the user is in the process of cutting the thick rope with the saw icon. In some embodiments, the thick rope may have a thickness associated with the number of pixels of motion required to cut the rope. In one embodiment, the thick rope may comprise an initial strength of 1700. In some embodiments, this means that to break the rope the user must make 1700 pixels of motion over the rope with the saw. In some embodiments, this may be 10 full strokes with the saw. Further, in such an embodiment, whenever the saw moves, the distance travelled by the saw is subtracted from the rope's strength. In such an embodiment, when the strength reaches zero, the saw disappears and the rope gradually fades away. In some embodiments, this gradual fade away may comprise a fade time of 0.3 seconds to an initial drop to 60% intensity.

As shown in FIG. 11B, once the user has cut the thick rope, the right side of the car 1104, which was associated with the thick rope falls. Further, in such an embodiment, the thin rope may be cut by a single swipe of the user's finger over the section of touch enabled display 1102 associated with the thin rope. In some embodiments, when the thin rope is cut, it then fades away and releases the car in the same manner as the thick rope.

As shown in FIG. 11C, once both ropes have been cut, car 1104 falls to the ground. In some embodiments, once the car 1104 has fallen to the ground, it may remain displayed on touch enabled display 1102 for a period of time. In some embodiments, once the period of time elapses, the car 1104 may move off of the screen to the right or left. For example, in one embodiment, when both ropes are cut the car may stay on the screen 0.5 seconds before moving away at a speed of, for example, 2000 pixels/second.

In some embodiments each of the ropes comprises an associated haptic effect that computing device 1101 outputs when the user interacts with the section of touch enabled display 1102 associated with the rope. Further, in some embodiments, a separate haptic effect may be output when the ropes are cut or when the car 1104 hits the ground. For example, in some embodiments, when the user interacts with the thick rope, computing device 1101 may output a haptic effect associated with a spatial grating with a pitch of 30 pixels when the saw is used. Further, in some embodiments, the intensity of the spatial grating may linearly drop from 100% to 40% as each swipe of the saw passes over the rope. Further, in some embodiments, when each rope is cut, computing device 1101 may output a separate effect. For example, in one embodiment, when cut both ropes may be associated with a 50-ms temporal pulse.

Figure 12A:
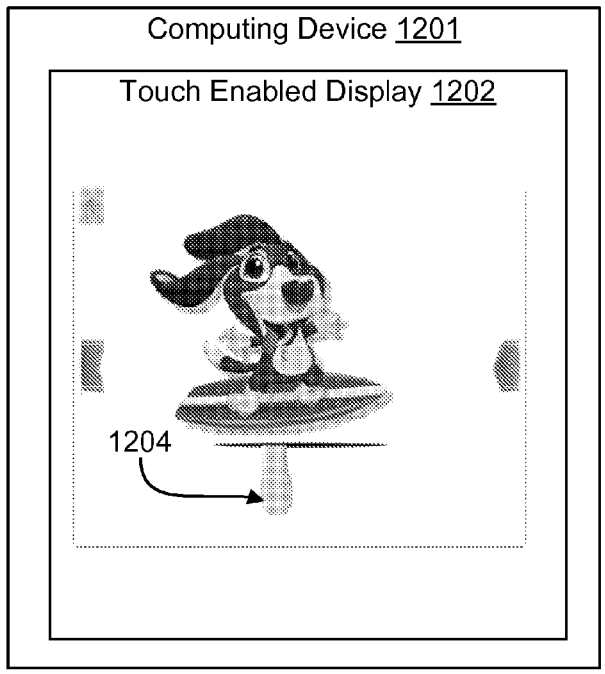
FIGS. 12A-12B are yet another illustration of a system for simulated physical interactions with haptic effects.
Figure 12B:
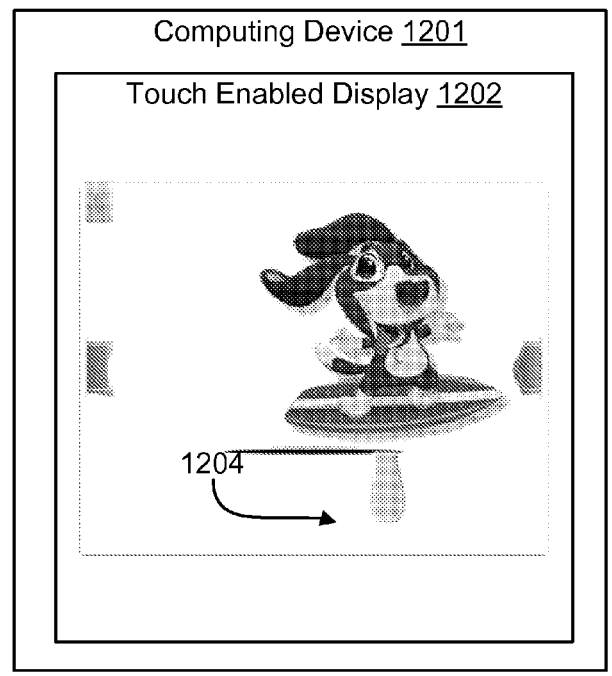

Turning now to FIGS. 12A-12B, which each comprise a computing device 1201 comprising a touch enabled display 1202. FIG. 12A comprises an interactive virtual paper book comprising tab 1204. As shown in FIGS. 12A-12B the user may interact with tab 1204 to move an object (shown in FIGS. 12A-12B as a surfing dog). In some embodiments, the tab 1204 may comprise an appearance similar to a virtual popsicle stick. In other embodiments, the tab 124 may comprise a different appearance (e.g., paper, metal, a knob, or some other object).

In some embodiments computing device 1201 may be configured to output a haptic effect each time the user interacts with tab 1204. For example, in one embodiment, computing device 1201 may be configured to output a haptic effect associated with a haptic signal comprising a 50 ms pulse whenever the user interacts with the tab 1204. Similarly, in some embodiments, another haptic effect is output whenever the object is moving. In some embodiments, this haptic effect may comprise a haptic effect associated with varying (e.g., increasing or decreasing) the perceived coefficient of friction. Similarly, in some embodiments, the haptic effect may comprise a haptic effect associated with a texture. In one embodiment, the haptic effect may comprise an effect associated with a haptic signal comprising 100-Hz sinusoid at 50% magnitude and a 100-Hz stochastic effect at 50% magnitude.

Figure 13A:
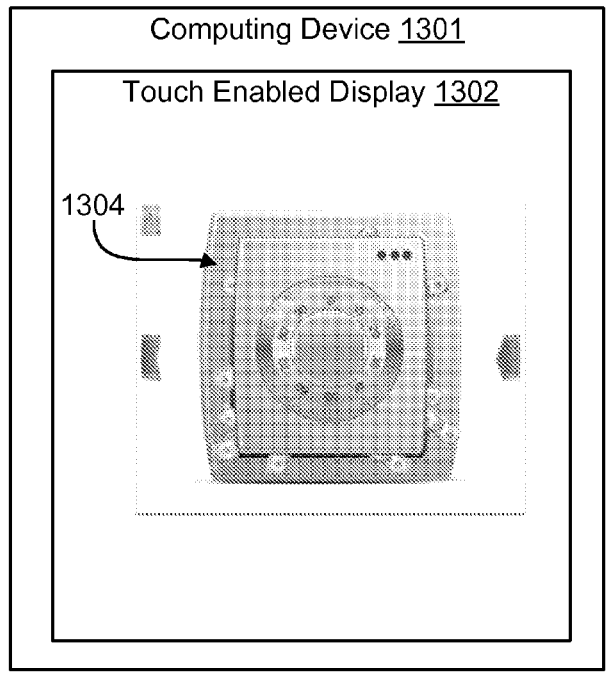
FIGS. 13A-13B are yet another illustration of a system for simulated physical interactions with haptic effects.
Figure 13B:
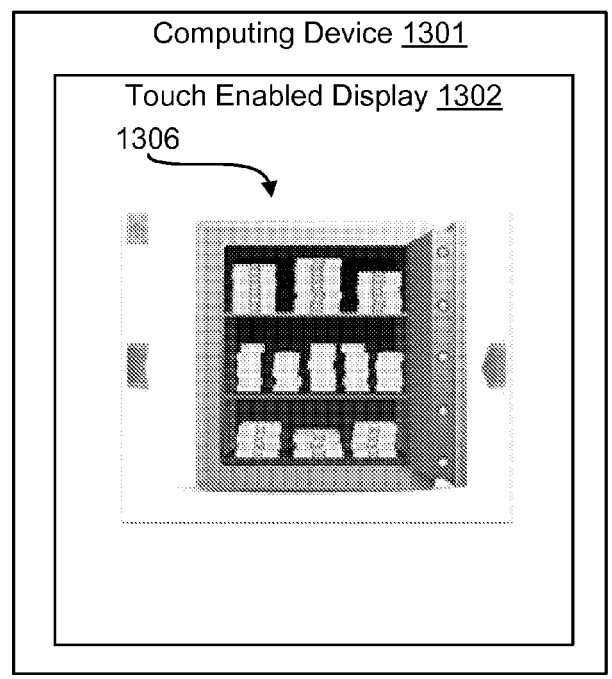

Turning now to FIGS. 13A-13B, which each comprise a computing device 1301 comprising a touch enabled display 1302. FIG. 13A comprises an interactive virtual safe 1304. In the embodiment shown in FIG. 13A, the user may be able to unlock the virtual safe 1304 by interacting with the virtual safe 1304. In some embodiments, this interaction may comprise turning a dial of the virtual safe 1304. For example, in one embodiment, the user may enter a combination in the virtual safe 1304 as with a standard dial based lock (e.g., by rotating a dial to the left and right to various preset coordinates). In some embodiments, computing device 1301 may be configured to display arrows to provide hints regarding the combination of the virtual safe 1304. For example, in one embodiment, arrows may gradually fade in and out to give hints whenever the user is moving the dial in the wrong direction to unlock the virtual safe 1304. In one embodiment, these arrows may increase in opacity at a rate of 5% per second when moving in the wrong direction, and fade away at a rate of 20% per second when moving in the right direction.

FIG. 13B shows an embodiment in which the user has opened the virtual safe 1306. In such an embodiment, the user may be able to close the virtual safe 1306 by an interaction that pushes the door, which then slams shut. Further, in some embodiments, the user may be able to further lock the safe by spinning the dial.

In some embodiments, the computing device 1301 may output different effects when the user interacts with different components of the safe 1304. For example, in one embodiment, when the user interacts with the door, the computing device may output a haptic effect associated with a haptic signal comprising 75 Hz sinusoid. Similarly, computing device 1301 may output a different haptic effect associated with opening or closing the safe. Further, when the user interacts with the dial of the safe, computing device 1301 may be configured to output a haptic effect similar to those discussed above with regard to FIGS. 3A-3C.

In some embodiments, the touch enabled display may comprise an icon that may be configured to control whether or not haptic effects will be output. In some embodiments, this icon may comprise a widget, such as a button, flag, or icon that the user may interact with to turn haptic effects on or off. Further, in some embodiments, the user may be able to vary the strength of the haptic effects by setting the icon in a particular location (e.g., by pushing a virtual switch to a certain point or pulling/pushing a virtual flag to a particular location). In some embodiments, the computing device may be configured to output haptic effects when the user interacts with this widget.

In still other embodiments, simulated physical interactions with haptic effects could be incorporated into games. For example, games often involve physical interactions that may be augmented with matching electrostatic based effects. For example, in one embodiment, as the user pulls back on a virtual slingshot, for example, the sling shot in a game that shoots one object at another group of objects, the computing device may output an effect associated with an increase in resistance. Similarly, if the user does not release the virtual slingshot, and instead gradually reduces the tension on the slingshot, the computing device may instead output a haptic effect configured to simulate the reduced tension. In one embodiment, this effect may comprise an effect configured to simulate a reduced texture or a reduced coefficient of friction. For example, such a haptic effect could be output by an electrostatic actuator or an actuator configured to vibrate at an ultrasonic frequency (e.g., greater than 20 kHz).

In other embodiments, haptic effects may be output to simulate the feeling of cutting. For example, in a touch screen game in which the user may slice objects using a swiping gesture of the user's finger. In some embodiments of the present disclosure, these interactions may be augmented with electrostatic or vibration-based effects that output an effect associated with the user's impact with an object. Further, in some embodiments, a second effect may be output to simulate the objects texture during slicing.

In still other embodiments, haptic effects may be output to simulate the feeling of sliding. For example, in a game that involves objects that slide against the screen or against one another, haptic effects could be output to simulate this interaction. For example, in one embodiment, as logs are moved along their long axis an electrostatic effect could be output to simulate a texture configured to simulate the brushing of logs against one another. Similarly, an electrostatic pulse could be used to replicate the impact of one log hitting another log or a barrier. In other embodiments, an electrostatic effect may be output to vary the user's perceived coefficient of friction when dragging his or her finger across the surface of the touch screen. In other embodiments, similar effects may be output using high frequency vibrations.

In still other embodiments, haptic effects may be output to simulate terminating at a specific location, or "docking" For example, in a flight simulator game, a user trace path for an incoming flight may further comprise a haptic effect to identify to the user that the airplane is on the correct approach. In such an embodiment, the electrostatic effects may produce a simulated texture or vary the coefficient of friction felt by the user. Similarly, haptic effects may replicate impacts as the plane lands on an airstrip.

Computing device of the present disclosure may be configured to output one or more of a plurality of haptic effects. In some embodiments, these haptic effects may be associated with textures. In some embodiments, this texture may comprise the texture of a liquid, e.g., water, oil, paint, or some other type of liquid. In such an embodiment, as the user's finger moves over top of a touch enabled display, the movement may disturb the liquid. In one embodiment, this may create ripples or other perturbations that are visible on the surface of touch enabled display. Further, in such an embodiment, the computing device may output a haptic effect configured to simulate the ripples or perturbations. For example, in one embodiment the ripples can be felt through a smooth electrostatic friction grating. In another embodiment, a haptic effect configured to simulate a texture or vary the coefficient of friction on the surface of the touch enabled display may be output. This haptic effect may simulate the presence of ripples or other types of perturbations in the liquid.

In another embodiment, the texture may comprise a texture associated with heat or fire. In such an embodiment, as the user's finger moves over top of the touch enabled display, the movement may disturb the flames. Further, in some embodiments, a haptic effect may simulate the intensity of the flames. For example, a haptic effect configured to simulate a texture or vary the coefficient of friction may be output to simulate the presence of the flames. In some embodiments, this haptic effect may be output by an electrostatic actuator. In other embodiments, it may be output by an actuator vibrating at an ultrasonic frequency.

In another embodiment, the texture may comprise a texture associated with a granular material, e.g., sand, pebbles, or a powder on a touch enabled display of computing a device. In such an embodiment, as the user's finger moves across the surface of touch enabled display the finger interacts with a pile of granular material. As the user interacts with the granular material, the computing device may output a haptic effect configured to simulate the interactions. For example, in one embodiment, the sliding of the granular material is accompanied by matching electrostatic feedback, such as a simulated texture generated by granular synthesis. In other embodiments, a haptic effect may be output by an actuator vibrating at an ultrasonic frequency. In some embodiments, the haptic effect is configured to simulate a texture on the surface of the touch enabled display. In other embodiments, the haptic effect is configured to vary the coefficient of friction the user feels on the surface of touch enabled display.

In another embodiment, the texture may be associated with a deposit, for example, water or powder on a touch enabled display of the computing device. In such an embodiment, as the user's finger moves across the surface of touch enabled display, the finger interacts with the deposit. In one embodiment, as the finger rubs across the surface, an electrostatic effect may be used to modulate friction, for example, to increase it as an underlying glass surface is revealed. In other embodiments, another type of actuator may be used. In still other embodiments, the haptic effect may be configured to simulate an associated texture on the surface of touch enabled display.

The embodiments above are examples of embodiments of simulated physical interactions with haptic effects. In other embodiments additional effects could be output. For example, embodiments of the present disclosure could be used to simulate worry beads on the surface of a touch enabled display. In such an embodiment, electrostatic friction may be used to simulate the sliding of the beads against the background as well as the beads' impact with one another. In another embodiment, bubble wrap may be shown on a display, and the user may be able to pop the bubbles by interacting with them. In such an embodiment, a haptic effect may be output as the user's finger slides against each bubble.

Advantages of Simulated Physical Interactions with Haptic Effects

There are numerous advantages of simulated physical interactions with haptic effects. Simulated physical interactions with haptic effects may allow the user to make a state determination (e.g., determine the mode a device is in) without having to look at the device. Thus, the user may be able to maintain focus on other tasks. For example, a user may be able to make determinations with regard to available operations on a user interface, without having to visually focus on the display. Similarly, a haptic effect may serve as a confirmation that an operation is available, has been completed, or is of a certain level of importance.

In other embodiments, simulated physical interactions with haptic effects may enable a user to use software and user interfaces more effectively. For example, a user may be able to make determinations regarding available operations in a program without having to visually focus on a display. Further, simulated physical interactions with haptic effects may allow touch screen devices to replace conventional switches. This may allow touch screen based devices to operate as multifunction controllers. It may further allow touch screen based devices to be used in previously unused places. This may reduce costs, and increase overall user satisfaction.

General Considerations

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process that is depicted as a flow diagram or block diagram. Although each may describe the operations as a sequential process, many of the operations can be performed in parallel or concurrently. In addition, the order of the operations may be rearranged. A process may have additional steps not included in the figure. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered. Accordingly, the above description does not bound the scope of the claims.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

Embodiments in accordance with aspects of the present subject matter can be implemented in digital electronic circuitry, in computer hardware, firmware, software, or in combinations of the preceding. In one embodiment, a computer may comprise a processor or processors. The processor comprises or has access to a computer-readable medium, such as a random access memory (RAM) coupled to the processor. The processor executes computer-executable program instructions stored in memory, such as executing one or more computer programs including a sensor sampling routine, selection routines, and other routines to perform the methods described above.

Such processors may comprise a microprocessor, a digital signal processor (DSP), an application-specific integrated circuit (ASIC), field programmable gate arrays (FPGAs), and state machines. Such processors may further comprise programmable electronic devices such as PLCs, programmable interrupt controllers (PICs), programmable logic devices (PLDs), programmable read-only memories (PROMs), electronically programmable read-only memories (EPROMs or EEPROMs), or other similar devices.

Such processors may comprise, or may be in communication with, media, for example tangible computer-readable media, that may store instructions that, when executed by the processor, can cause the processor to perform the steps described herein as carried out, or assisted, by a processor. Embodiments of computer-readable media may comprise, but are not limited to, all electronic, optical, magnetic, or other storage devices capable of providing a processor, such as the processor in a web server, with computer-readable instructions. Other examples of media comprise, but are not limited to, a floppy disk, CD-ROM, magnetic disk, memory chip, ROM, RAM, ASIC, configured processor, all optical media, all magnetic tape or other magnetic media, or any other medium from which a computer processor can read. Also, various other devices may include computer-readable media, such as a router, private or public network, or other transmission device. The processor, and the processing, described may be in one or more structures, and may be dispersed through one or more structures. The processor may comprise code for carrying out one or more of the methods (or parts of methods) described herein.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

What is claimed:

1. A system comprising:
   a sensor configured to detect a user interaction with a touch surface and transmit a sensor signal associated with the user interaction;
   a processor in communication with the sensor, the processor configured to:
   determine a type and a position of the user interaction based on the sensor signal,
   determine a feature associated with the position of the user interaction,
   control one of a plurality of devices based on the user interaction, the controlled device associated with the feature,
   modify a display signal based in part on the user interaction,
   determine a first haptic effect based at least in part on the type and the position of the user interaction and, the first haptic effect configured to simulate contact with the feature;
   transmit a first haptic signal to generate the first haptic effect;
   determine a second haptic effect configured to simulate selection of the feature after contact with the feature, the second haptic effect configured to distinguish the controlled device from the other of the plurality of devices, the second haptic effect different from the first haptic effect; and
   transmit a second haptic signal to generate the second haptic effect, and
   a haptic output device in communication with the processor and coupled to the touch surface, the haptic output device configured to receive the first haptic signal and output the first haptic effect, and receive the second haptic signal and output the second haptic effect.

2. The system of claim 1, wherein at least one of the first or second haptic effects comprises a simulated texture or an effect configured to vary a coefficient of friction on the touch surface.

3. The system of claim 1, wherein the haptic output device comprises a device configured to generate an electrostatic field.

4. The system of claim 1, wherein the sensor comprises a touchscreen display.

5. The system of claim 1, wherein the feature is associated with a file in a virtual desktop.

6. The system of claim 5, wherein the haptic effect is associated with moving the file.

7. The system of claim 1, wherein the feature is associated with an object in a game.

8. The system of claim 7, wherein the haptic effect is associated with movement of the object.

9. The system of claim 1, wherein the feature is associated with a simulated input device.

10. The system of claim 9, wherein the simulated input device comprises one or more of: a virtual switch, a virtual slider, a virtual button, a virtual joystick, a virtual mouse, or a virtual dial.

11. The system of claim 9, wherein the simulated input device is configured to control a function of the system.

12. A method comprising:
    detecting a user interaction with a touch surface;
    transmitting a sensor signal associated with the user interaction;
    determining a type and a position of the user interaction based on the sensor signal;
    determining a feature associated with the position of the user interaction;
    controlling one of a plurality of devices based on the user interaction, the controlled device associated with the feature;
    modifying a display signal based in part on the user interaction;
    determining a first haptic effect based at least in part on the type and the position of the user interaction, the first haptic effect configured to simulate the feature;
    determining a second haptic effect configured to simulate selection of the feature after contact with the feature, the second haptic effect configured to distinguish the controlled device from the other of the plurality of devices, the second haptic effect different from the first haptic effect;
    transmitting a first haptic signal associated with the haptic effect to a haptic output device; and
    transmitting a second haptic signal associated with the haptic effect to the haptic output device.

13. The method of claim 12, wherein at least one of the first or second haptic effects comprises one of a simulated texture or an effect configured to vary a coefficient of friction on the touch surface.

14. The method of claim 13, wherein the haptic effect is associated with moving a file.

15. The method of claim 12, wherein the feature is associated with a file in a virtual desktop.

16. The method of claim 12, wherein the feature is associated with a character in a game.

17. The method of claim 16, wherein the haptic effect is associated with a movement of the character.

18. The method of claim 12, wherein the feature is associated with a simulated input device.

19. The method of claim 18, wherein the simulated input device comprises: a virtual switch, a virtual slider, a virtual button, a virtual joystick, a virtual mouse, or a virtual dial.

20. The method of claim 18, wherein the simulated input device is configured to control a function of a system.

21. A non-transient computer readable medium comprising program code, which when executed by a processor is configured to cause the processor to:
    detect a user interaction with a touch surface;
    transmit a sensor signal associated with the user interaction;
    determine a type and a position of the user interaction based on the sensor signal;
    determine a feature associated with the position of the user interaction;
    control one of a plurality of devices based on the user interaction, the controlled device associated with the feature;
    modify a display signal based in part on the user interaction;
    determine a first haptic effect based at least in part on the type and the position of the user interaction, the first haptic effect configured to simulate the feature;
    transmit a first haptic signal associated with the haptic effect to a haptic output device;
    determine a second haptic effect configured to simulate selection of the feature after contact with the feature, the second haptic effect configured to distinguish the controlled device from the other of the plurality of devices, the second haptic effect different from the first haptic effect, and wherein at least one of the first or second haptic effects comprises a simulated texture or an effect configured to vary a coefficient of friction on the touch surface; and
    transmit a second haptic signal associated with the haptic effect to the haptic output device.

* * * * *